(12) United States Patent
Narushima et al.

(10) Patent No.: US 6,549,277 B1
(45) Date of Patent: Apr. 15, 2003

(54) ILLUMINANCE METER, ILLUMINANCE MEASURING METHOD AND EXPOSURE APPARATUS

(75) Inventors: Hiroaki Narushima, Tokyo (JP); Toshihiko Tsuji, Urawa (JP)

(73) Assignee: Nikon Corporation, Tokyo (JP)

( * ) Notice: Subject to any disclaimer, the term of this patent is extended or adjusted under 35 U.S.C. 154(b) by 70 days.

(21) Appl. No.: 09/666,425

(22) Filed: Sep. 21, 2000

(30) Foreign Application Priority Data

Sep. 28, 1999 (JP) .......................................... 11-275379

(51) Int. Cl.$^7$ .................................................. G01J 1/42
(52) U.S. Cl. ...................................................... 356/218
(58) Field of Search ................................. 356/213, 218, 356/221, 399–401; 355/43, 53, 68, 77

(56) References Cited

U.S. PATENT DOCUMENTS

| 4,585,342 A | 4/1986 | Lin et al. |
| 4,746,958 A | 5/1988 | Yamakawa |
| 5,825,470 A | 10/1998 | Miyai et al. |

FOREIGN PATENT DOCUMENTS

| JP | 8-166475 | 6/1996 |
| JP | 8-330224 | 12/1996 |
| JP | 9-266166 | 10/1997 |
| JP | 10-74861 | 3/1998 |
| JP | 10-163097 | 6/1998 |
| JP | 11-260706 | 9/1999 |
| JP | 11-275379 | 10/1999 |

*Primary Examiner*—Michael P. Stafira
(74) *Attorney, Agent, or Firm*—Oliff & Berridge PLC

(57) ABSTRACT

An illuminance meter is provided to simplify measuring tasks and labor associated with the process of determining the energy level of a radiation used in an exposure apparatus. A wafer-type illuminance meter has an optical sensor fabricated integrally within a dummy wafer, which is made of a thin disk so that it may be handled in a manner similar to a substrate wafer to be imprinted. The illuminance meter is retained on a wafer stage in a manner similar to the substrate wafer so as to be loaded on and unloaded off a number of exposure apparatuses to determine a level of illuminance in the vicinity of the image plane of each exposure apparatus that uses a type of radiation assigned to each exposure apparatus.

23 Claims, 13 Drawing Sheets

ILLUMINANCE METER, ILLUMINANCE MEASURING METHOD AND EXPOSURE APPARATUS

BACKGROUND OF THE INVENTION

1. Field of the Invention

The present invention relates to an instrument for measuring illumination levels, a method of measuring illumination, and an exposure apparatus, and relates in particular to an illuminance meter used to measure relative illumination levels in several exposure apparatuses, a method of using the illuminance meter and an exposure apparatus equipped with the illuminance meter. This application is based on Japanese Patent Application Nos. 10-74861 and 11-275379, and the contents of which are incorporated herein by reference.

2. Description of the Related Art

A projection exposure apparatus is used in manufacture of semiconductor devices and liquid crystal displays and others, to imprint a pattern prepared on a mask or reticle (referred to as masking below) on a photo-sensitive substrate base such as a semiconductor wafer or a transparent substrate plate coated with a photo-sensitive material. In plants producing semiconductor devices and liquid crystal devices, projection exposure apparatus is not used singly, but in general, a group of such projection exposure apparatuses are used concurrently.

In such a production plant, to minimize the variation in the quality of products produced in different exposure apparatuses, it is necessary to match the operating exposure levels in different exposure apparatuses. For this reason, an internal optical sensor is installed in each exposure apparatus to indirectly determine the operating level of illumination at the image plane, and based on the results of such measurements, exposure levels of different apparatuses are matched accordingly. However, it is not guaranteed that each internal optical sensor provided in each apparatus always produce correct levels of illumination, because of chronological changes and other transitory factors that occur during the production process, so that the internal sensors must always be calibrated and adjusted accordingly.

Also, it is necessary to intensively control relative levels of illumination in order to match the productivity of exposure processing achieved in each apparatus.

Therefore, an illuminance meter is used to measure the relative illumination levels of different exposure apparatuses. The meter is detachable from an adapter section provided in the vicinity of a wafer holder disposed on the wafer stage so that an operator inserts the meter manually in the adapter to measure illuminance at the image plane. After completing illuminance measurements on one exposure apparatus, the operator repeats the same process successively on other exposure apparatuses to complete the task of determining the relative illumination levels.

However, because other parts of the projection optical system are also located in the vicinity of the wafer stage, it is necessary for the operator to attach and detach the illuminance meter by inserting an arm through a very limited space, and also, because the wafer stage is located some distance away from the operator, such a process is not easily carried out and is time-consuming, and furthermore, there is always a danger that the operator's arm may brush against the wafer stage or other precision instruments located nearby, resulting in damaging or contaminating the system with dust particles to affect the performance of the projection optical system.

Another problem associated with such a process of illuminance measurement is that the work is sometimes carried out by interrupting the on-going exposure process, but attaching/detaching actions cause temperature disturbance inside the projection chamber housing of the exposure apparatus due to opening/closing of chamber door and other factors. It takes a long time for the chamber temperature to stabilize after the completion of a measuring task, and the exposure process cannot be resumed during this period.

SUMMARY OF THE INVENTION

It is, therefore, an object of the present invention to simplify the task of illuminance measurement of the illumination light in a projection optical system in an exposure apparatus, and to shorten the time required to perform such illuminance measurements.

The present invention is explained in the following by affixing reference numerals to various elements illustrated in the drawings, but the present invention is not limited to those parts illustrated in the drawings with reference numerals.

The present illuminance meter (50) determines a level of illuminance of a radiation in the vicinity of the image plane of an exposure apparatus used to expose a pattern fabricated on a masking (11) onto a photo-sensitive substrate base (14) retained on a wafer stage (28) through an optical projection system (13) of the exposure apparatus, and a feature of the present invention is that an optical sensor (illuminance determination section 52) is provided in an instrument plate (dummy wafer 51), which is made as a thin disk so that the meter can be transported in a manner similar to the photo-sensitive base (14).

Because the illuminance meter is made into a thin disk form, it can be handled in a manner similar to regular photo-sensitive substrate bases, and be transported using the transport system (103) for the bases to be loaded/retained on the substrate stage to perform the task of illuminance measurements in the as-loaded condition, and after the task is completed, the base can be transported from the exposure apparatus to other processing stations.

Therefore, there is no need to mount/dismount the substrate base from the substrate stage as in the conventional technique, resulting in a simplified process of illuminance measurements. Also, there is no need for opening/closing the door to the controlled environment chamber so that the waiting time for the environment to return to normal is not necessary and measurements can be performed quickly, and therefore, the present illuminance meter enables to minimize interruptions caused by the task of illuminance measurements and to perform such measurements very efficiency.

The present method of determining a level of illuminance is based on using an illuminance meter (50) having an instrument plate (dummy wafer 51) formed with an optical sensor (illuminance determination section 52), and a feature that the instrument plate is made as a thin disk so that the meter (50) can be transported in a manner similar to regular photosensitive bases (14), to be loaded/unloaded onto/from a wafer stage (28) of a plurality of exposure apparatuses (30a, 30b, 30c, 30d) to determine an individual level of illuminance in the vicinity of the image plane of the optical projection system (13) of each exposure apparatus.

In the present method, because the illuminance meter is made in a form of a thin disk that can be transported in a manner similar to regular photo-sensitive substrate bases and illuminance measurements are made by loading and unloading the illuminance meter to the substrate stage in a manner similar to regular photo-sensitive bases to determine illuminance of each exposure apparatus, there is no need to mount and dismount an illuminance meter on and off the substrate stage as in the conventional technique, thus greatly simplifying the task of illuminance measurements.

Also, because there is no need for opening/closing the door to the controlled environment chamber so that the waiting time for the environment to return to normal is not necessary and measurements can be performed quickly, so that measurements of illuminance, in a production line that has a plurality of exposure apparatuses for making semiconductor devices based on photolithography, can also be performed quickly and management of each exposure apparatus is facilitated.

The present exposure apparatus performs exposure of a pattern fabricated on a making (11) on a photo-sensitive substrate base (14) held on a substrate holder (dummy holder 151) that is retained on a wafer stage (28) through an optical projection system (13) of an exposure apparatus, and a feature is that substrate holder can be freely attached/detached on/off the substrate stage, and an optical sensor (52) is provided on a holding surface of the substrate holder for holding the photo-sensitive substrate base.

Because the exposure apparatus has a substrate holder that can be freely attached to or detached from the substrate stage, and has the illuminance detection section therein, the substrate holder can be transported using the transport system (103) to load/unload the substrate holder on/off the substrate stage and to perform measurements in the as-loaded condition, and after the task is completed, the substrate holder can be transported from the substrate stage. Therefore, there is no need to mount/dismount the substrate base on/off the substrate stage as in the conventional technique, resulting in a simplified process of illuminance measurements. Also, there is no need for opening/closing the door to the controlled environment chamber so that the waiting time for the environment to return to normal is not necessary and measurements can be performed quickly, and therefore, the present illuminance meter enables to minimize interruptions cause by illuminance determination and to perform illuminance measurements very efficiency.

Further, a feature in the present method of illuminance measurements is that it is based on the use of a substrate holder (dummy holder 151) that can be freely attached/detached from the substrate stage (28) and has an integral optical sensor (52), so that the task of illuminance measurements can be performed by loading/unloading the substrate holder on the substrate stage to successively determine individual levels of illuminance in the vicinity of the image plane of the optical projection system for each exposure apparatus (30a, 30b, 30c, 30d).

Because the present method of illuminance measurements is based on a substrate holder, having the illuminance detection section integrated therein, that can be freely attached to or detached from the substrate stage, and illuminance measurements can be taken by loading/unloading the substrate holder on/off the substrate stage, there is no need to mount/dismount the substrate base from the substrate stage as in the conventional technique, resulting in a simplified process of illuminance measurements.

Also, because there is no need for opening/closing the door to the controlled environment chamber so that the waiting time for the environment to return to normal is not necessary and measurements can be performed quickly, so that measurements of illuminance, in a production line that has a plurality of exposure apparatuses for making semiconductor devices based on photolithography, can also be performed quickly and management of each exposure apparatus is facilitated.

BRIEF DESCRIPTION OF THE DRAWINGS

FIG. 12 is a perspective view of an illuminance meter in Embodiment 3 and a holder exchanger in.

DESCRIPTION OF THE PREFERRED EMBODIMENTS

Preferred embodiments will be presented in the following with reference to the drawings.

Embodiment 1

(1) Photolithographic System

Figure 3:
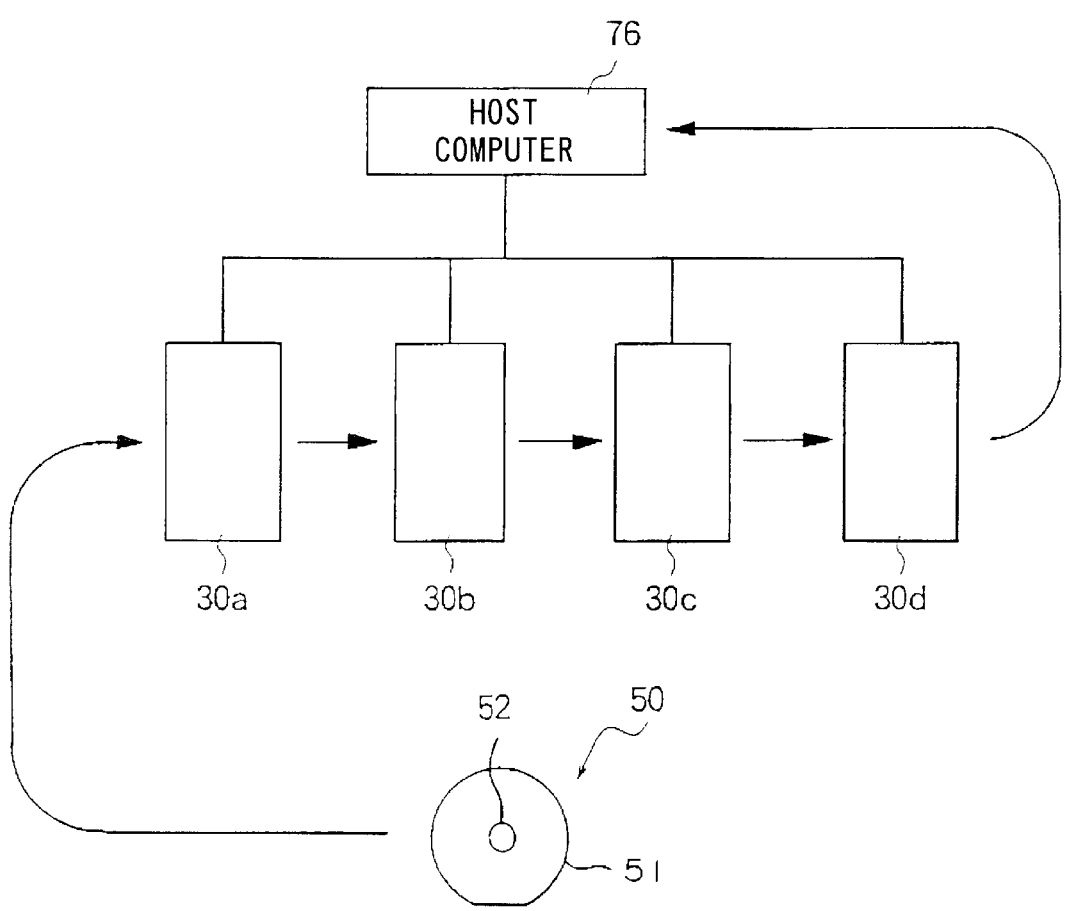
FIG. 3 is a schematic diagram of a photolithographic system.

Photolithographic system is used in conjunction with the illuminance meter of the present invention in manufacturing semiconductor integrated devices so that, as indicated in FIG. 3, an exposure apparatus 30a, having a KrF excimer laser as its illumination source, operates along with a number of exposure apparatuses 30b~30d having a ArF excimer laser as their laser source. The two types of exposure apparatuses 30a~30d are connected to a common host computer 76 for monitoring and controlling the operating conditions of each exposure apparatus. The levels of illumination of exposure apparatuses 30*a*~30*d* are measured by a wafer-type illuminance meter 50 to be shared among the exposure apparatuses for the purpose of matching the illumination levels of the various exposure apparatuses. Although Embodiment 1 is based on two types of exposure apparatuses, the present illuminance meter is applicable to a production line based on a single type for all the exposure apparatuses or a plurality of different types for the exposure apparatuses.

(2) Optical System of Exposure Apparatus

First, the exposure apparatus 30*a*, especially its optical system, will be explained with reference to FIG. 4. Although explanations for other exposure apparatuses 30*b*18 30*d* will be omitted, the basic structure is common to all the exposure apparatuses, and the only difference is the light source used for the exposure light.

Figure 4:
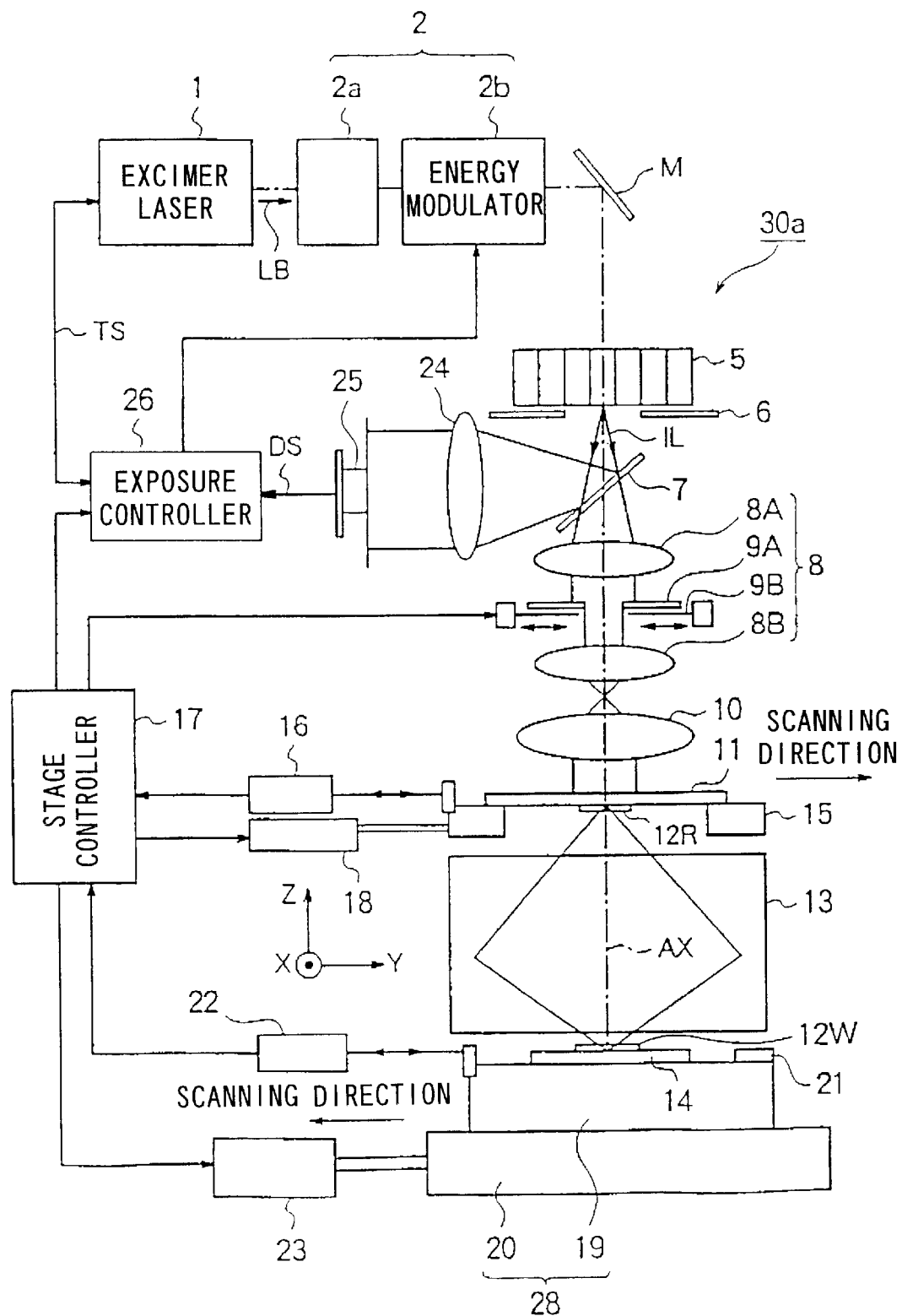
FIG. 4 is a schematic diagram of an example of the projection exposure system.

As shown in FIG. 4, the exposure apparatus 30*a* is based on the step-and-scan method, in which a part of the (circuit) pattern fabricated on the reticle 11, which serves as masking, is projected through the projection optical system 13 to form a reduced image of the reticle 11 on a wafer 14, which represents the substrate base and is coated with a photoresist material. The reticle 11 and the wafer 14 are moved synchronously across the projection optical system 13 to imprint the pattern in each shot region defined on the wafer 14, thereby manufacturing many semiconductor devices on one wafer 14.

The exposure apparatus 30*a* is operated by a KrF excimer laser (oscillation wavelength 248 nm) serving as an exposure light source 1. The pulses of laser beam LB emitted from the exposure light source 1 are entered in the beam shaping and modulating optical system 2. In this embodiment, shaping and modulating optical system 2 is comprised by beam shaping optical system 2*a* and an energy modulator 2*b*. The beam shaping optical system 2*a* includes cylindrical lenses and beam expanders and the like, and adjusts the cross sectional shape of the beam so as to effectively enter the beam into the flyeye lens 5 located further down in the system.

The energy modulator 2*b* shown in FIG. 4 is comprised by a coarse energy adjuster and a fine energy adjuster and others. The coarse energy adjuster is comprised by a plurality of neutral density (ND) filters, having different transmittance (=1−optical power attenuation)×100%), disposed on a freely rotatable revolver so that the transmittance of entered laser beam LB can be adjusted from 100% in several steps. It is also permissible to arrange another similar revolver in a second stage to produce a two-stage ND filter that is capable of providing a finer adjustment of transmittance. The fine energy adjuster is able to micro-adjust the transmittance of laser beam LB continuously within a certain range, by using the double grating method or a method based on two parallel plates of variable inclination angle. Instead of the fine energy adjuster, it is also permissible to provide micro-adjustment of laser beam LB by output modulation of the laser beam source 1.

In FIG. 4, the laser beam LB emitted from the beam shaping and modulating optical system 2 enters the flyeye lens 5 through a mirror M for bending the optical path. The flyeye lens 5 forms a multitude of secondary light sources for illuminating the reticle 11 with uniform illumination. An aperture stop (so-called σ-stop) 6, which is a part of the illumination system, is provided on the output surface of the flyeye lens 5, and the laser beam (referred to as illumination pulse IL) emitted from the secondary light source inside the aperture stop 6 enters a beam splitter 7 having a low reflectance and high transmittance. The pulsed illumination light IL, that propagated through the beam splitter 7 as the exposure beam, is entered in the condenser lens 10 by way of a relay lens 8.

The relay lens 8 includes a first relay lens 8A, a second relay lens 8B, and a fixed illumination field stop (fixed reticle blind) 9A and a movable illumination field stop 9B disposed between the relay lenses 8A, 8B. The fixed illumination field stop 9A has a rectangular opening, and the pulsed illumination light IL that passed through the beam splitter 7 is made to pass through the rectangular opening of the fixed illumination field stop 9A by way of the first relay lens 8A. Also, the fixed illumination field stop 9A is positioned near a plane conjugate to the reticle pattern. The movable illumination field stop 9B has an opening section, whose location in the scanning direction and width can be altered, and is disposed near the fixed illumination field stop 9A. The purpose of the movable illumination field stop 9B is to further limit the illumination field at the start and end points of scanning exposure by operating the movable illumination field stop 9B so as to prevent exposing unwanted regions (regions other than the shot region to be imprinted with the reticle pattern) by using the movable illumination field stop 9B to further limit the illumination field.

As shown in FIG. 4, the pulsed illumination light IL that propagated through the fixed illumination field stop 9A and the movable illumination field stop 9B, further propagates through the second relay lens 8B and the condenser lens 10, and distributes illumination uniformly over a reticle illumination window 12R of a rectangular shape on the reticle 11 held on the reticle stage 15. The pattern inside the reticle illumination window 12R on the reticle 11 is reduced in a size by projecting through the projection optical system 13 at a projection ratio α(where α may be 1/4, 1/5, 1/6 for example), and is focused onto the wafer exposure window (illumination field) 12W of a rectangular shape on the wafer (photo-sensitive base) 14 coated with a photoresist film. In the following presentation, z-axis refers to an axis parallel to the optical axis AX of the projection optical system 13, y-axis to the scanning direction of the reticle 11, with respect to the reticle illumination window 12R, lying on a plane orthogonal to the optical axis AX (i.e., parallel to the plane of the paper in FIG. 4), and x-axis to a non-scanning direction perpendicular to the scanning direction.

The reticle stage 15 is moved in y-direction by a reticle stage drive section 18. Y-coordinate of the reticle stage 15 determined by an external laser interferometer 16 is supplied to the stage controller 17, which controls the position and speed of the reticle stage 15 through the reticle stage drive section 18, according to the supplied coordinate.

In the meantime, the wafer 14 held on a wafer holder WH is placed on a wafer stage 28. The wafer stage 28 is comprised by a Z-tilt stage (specimen stand) 19 and an x-y stage 20 for installing the z-tilt stage 19. The x-y stage 20 is used to position the wafer 14 in x- and y-directions, as well as to scan the wafer 14 in y-direction. The z-tilt stage 19 is used to adjust the position of the wafer 14 in the z-direction (for focusing), and also to adjust the tilt angle of the wafer 14 with respect to the x-y plane. The position data such as x-, y-coordinates and rotational angle of the x-y stage 20 (wafer 14) determined by the moving mirror fixed on the z-tilt stage 19 and the external laser interferometer 22 are supplied to the stage controller 17, which controls the position and speed of the x-y stage 20 by means of the wafer stage drive section 23 according to the position data.

Also, the stage controller 17 is operated by a central controller (not shown) that controls the overall operation of the projection exposure apparatus. For scanning exposure process, the reticle 11 is scanned in +y (or −y) direction in relation to the reticle illumination window 12R at a speed VR, by means of the reticle stage 15; and synchronously the wafer 14 is moved in −y (or +y) direction at a speed α·VR (where α is a projection magnification factor from the reticle 11 to wafer 14) with respect to the illumination field 12W, using the x-y stage 20.

Also, an illumination uniformity sensor 21 comprised by a photoelectric converter element is provided at all times in the vicinity of the wafer 14 held on the z-tilt stage 19 so that the incident surface of the illumination uniformity sensor 21 is at the same height as the wafer surface. The illumination uniformity sensor 21 should be based on a photoelectric sensors such as a PIN-type photodiode that responds to ultra-violet waves and has a high response frequency to able to determine the pulsed illumination light. Detected signals of the illumination uniformity sensor 21 are supplied to the exposure controller 26 by way of a peak hold circuit (not shown) and an analogue/digital converter (A/D converter).

Figure 1:
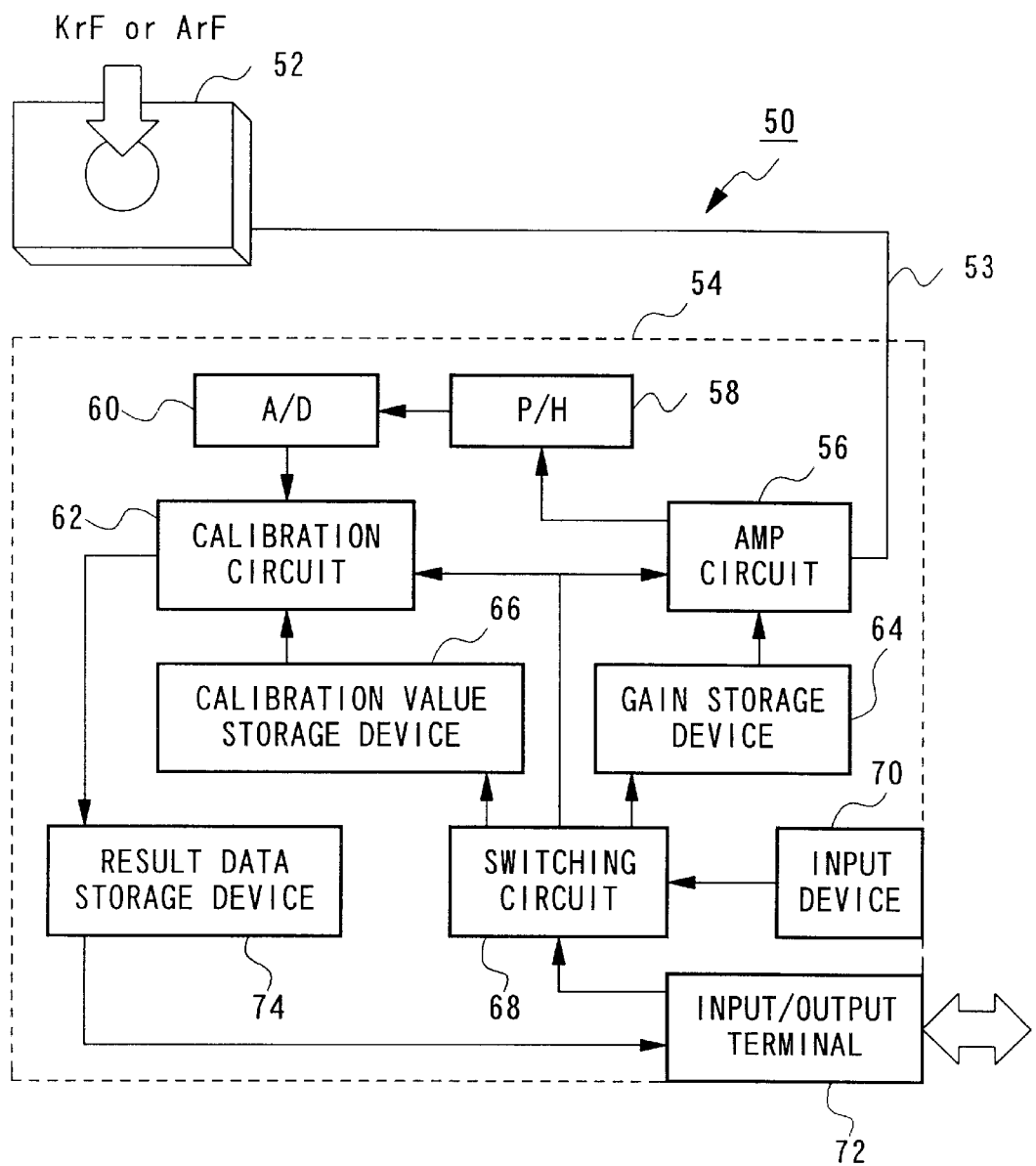
FIG. 1 is a block diagram of a circuit configuration of the illuminance meter in an embodiment of the present invention.

The illumination pulses IL reflected from the beam splitter 7 shown in FIG. 1 are received by way of the focusing lens 24 in the integrator sensor 25 comprised by a photoelectric converter element, and the photo-electrically (p-e) converted signals from the integrator sensor 25 are supplied as digital output signals DS to the exposure controller 26 by way of the peak hold circuit and the A/D converter. The correlation coefficient α1 between the digital output signals DS from the integrator sensor 25 and the pulse energy per unit area of the wafer surface (exposure level in mj/cm$^2$) produced by the illumination pulse IL are predetermined using the illuminance meter, and is stored in the exposure controller 26. The exposure controller 26 controls laser emission timing and power. The exposure controller 26 further controls optical power reduction in the energy modulator 2b, and the stage controller 17 controls the opening/closing of the movable illumination field stop 9B in synchronization with the operation of the stage system.

(3) Wafer Transport System

Figure 7:
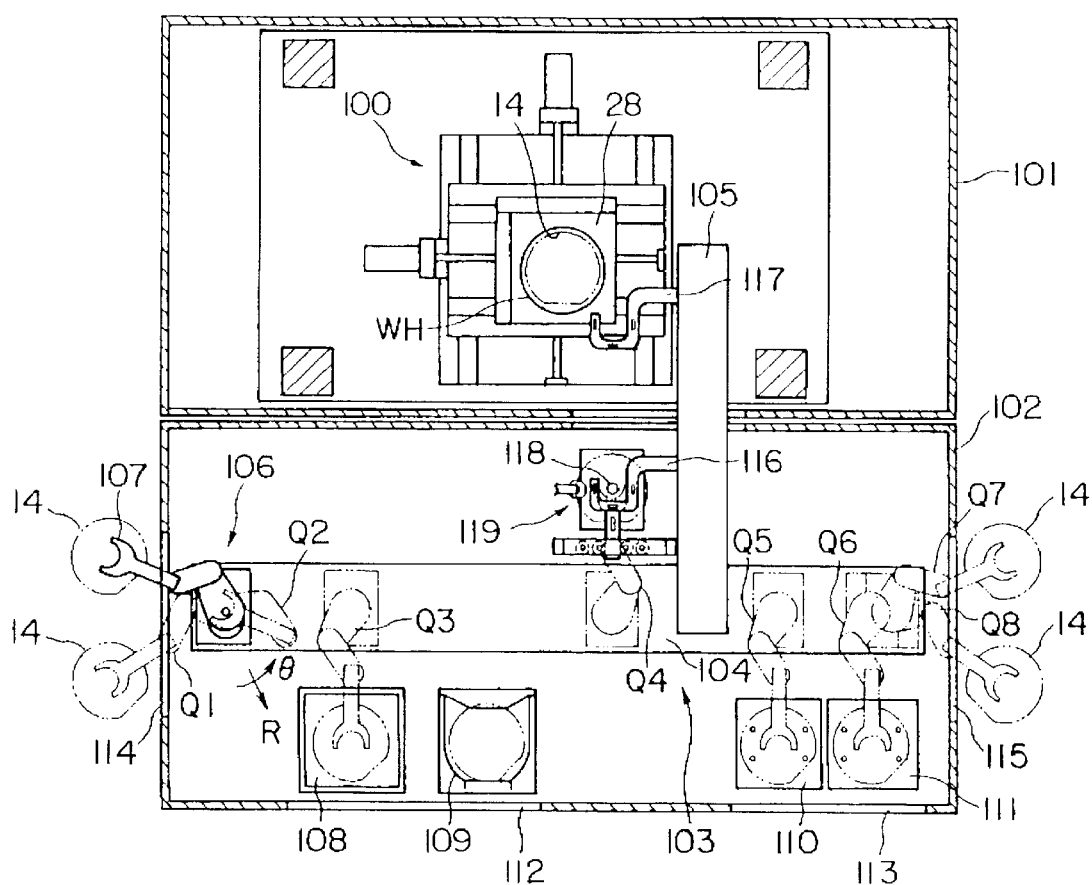
FIG. 7 is a cross sectional plan view of the exposure apparatus including the wafer transport system and others.

Next, the wafer transport system of the exposure apparatus will be explained. The exposure apparatus has an automatic wafer transport apparatus. Such a wafer transport apparatus may be similar to a wafer transport apparatus disclosed in a U.S. patent application Ser. No. 09/348,234. This wafer transport apparatus will be explained with reference to FIG. 7.

The optical system 100 of the exposure apparatus shown in FIG. 4 is installed in a first independent chamber 101 that is air-conditioned. The wafer holder WH is retained on the wafer stage 28 (z-tilt stage 19) by vacuum suction, and the wafer 14 to be exposed is retained on the wafer holder WH by vacuum suction.

An orientation flat (or notch) is formed on a portion of the outer periphery of the circular-shaped wafer 14 so that the wafer 14 may be loaded on the wafer holder WH with the orientation flat facing a specific direction and the wafer center located in a specific position with respect to the wafer holder WH. In this embodiment, the automated wafer transport apparatus (transport system) 103 for loading the wafer 14 on the wafer holder WH, and unloading the wafer 14 from the wafer holder WH is disposed in a second independent chamber 102 adjacent to the first independent chamber 101.

A guide section of the wafer transport apparatus 103 is comprised by a lateral slider body 104 extending in x-direction and a transverse slider body 105 extending in y-direction, and a SCALAR-type (selective compliance assembly robot) robotic hand 106 is disposed on the lateral slider body 104 so as to be freely slidable in x-direction. The robotic hand 106 is a multi-joint robot having a hand section 107 for retaining the wafer 14 by vacuum suction, and is able to move along the lateral slide body 104 in x-direction, and can freely move the hand section 107 in θ- and R-directions.

In the vicinity of the lateral slider body 104, a wafer storage shelves 108, 109 for storing the wafer 14 are fixed, and temporary storage platforms 110, 111 for placing the wafer 14 temporarily are provided. A plurality of (four) pins are installed on the temporary storage platforms 110, 111. In the vicinity of the wafer storage shelves 108, 109 and on the side surface of the second independent chamber 102 disposed in the vicinity of the temporary storage platforms 110, 111, openings 112, 113 are provided for accessing the chamber interior when it is required to exchange some component members such as the storage shelves 108, 109. Doors (not shown) are provided for installing on these openings 112, 113 by means of door frame units.

The wafer 14 can be accessed from the interior of the second independent chamber 102 for processing in some external processing apparatus (such as photo-resist coating apparatus or resist developing apparatus) by extending the hand section 107 of the robotic hand 106 through the opening 114 provided on the left side of the second independent chamber 102 or from another position Q1. Similarly, the wafer 14 can also be accessed from the chamber interior by moving the robotic hand 106 to Q7 and extending the hand section 107 through an opening 115 provided on the right surface of the second independent chamber 102 or from another position Q8. The wafer 14 can also be handled within the chamber interior by moving the robotic hand 106 to positions Q3, Q5 or Q6 to correspond, respectively, with the storage shelf 108, temporary holding platform 110 or 111.

Also, the transverse slider 105 extends into the interior of the first independent chamber 101 by way of the opening provided on the side surface of the first independent chamber 101 and the opening provided on the side surface of the second independent chamber 102, and two sliders (transport arms) 116, 117, which are freely slidable in the longitudinal direction and have U-shaped sections to support the wafer 14, are provided on the side surface of the transverse slider body 105. The sliders 116, 117 can move between the first and second independent chambers 101, 102 while holding the wafer 14 by means of vacuum suction. For example, the robotic hand 106 removes a wafer 14 from a storage shelf 108 and hands it over to the slider 116 or 117 in position Q4 by means of elevating turntable 118. The robotic hand 106 subsequently receives an exposed wafer 14 from slider 116 or 117 through an elevating turntable 118, and returns the exposed wafer 14 to the storage shelf 108, for example.

Here, those parts of the robotic hand 16 to touch the wafer 14, such as the hand section 107, sliders 116, 117 are made of a conductive ceramic material to produce a very fine-grained surface structure. It is also permissible to apply a coating to produce such a fine structured surface on the surfaces to touch the wafer 14.

A pre-alignment device 119, having a sensor for determining the center of the wafer 14 and its orientation, and other devices are disposed in the vicinity of position Q4 where the lateral slider body 104 crosses the transverse slider body 105.

The robotic hand 106 places the wafer 14 on the turntable 118 so that the center of the wafer 14 coincides with the rotational center of the turntable 118. In the meantime, the slider 116 is moved below the back surface of the wafer 14. The wafer 14 is vacuum chucked to the turntable 118.

The turntable 118 is rotated in this condition, and the orientation notch of the wafer 14 is determined, and depending on the results, for example when the orientation notch is opposite to the lateral slider body 104, the turntable 118 is stopped. Then, wafer 14 is released from the turntable 118, and the turntable 118 is lowered while the top surface of the wafer 14 is vacuum chucked to the upper surface of the slider 116. Next, the slider 116 is moved along the transverse slider body 105 towards the first chamber 101, and the wafer 14 is transferred from the slider 116 to the wafer holder WE by means of vertically movable transfer device (wafer handling device) comprised by pins and the like. The structure of the wafer handling device will be described later. This transfer takes place in such a way that the wafer center and the orientation notch are positioned accurately in the desired locations to position the wafer 14 precisely on the wafer holder WH.

Figure 5:
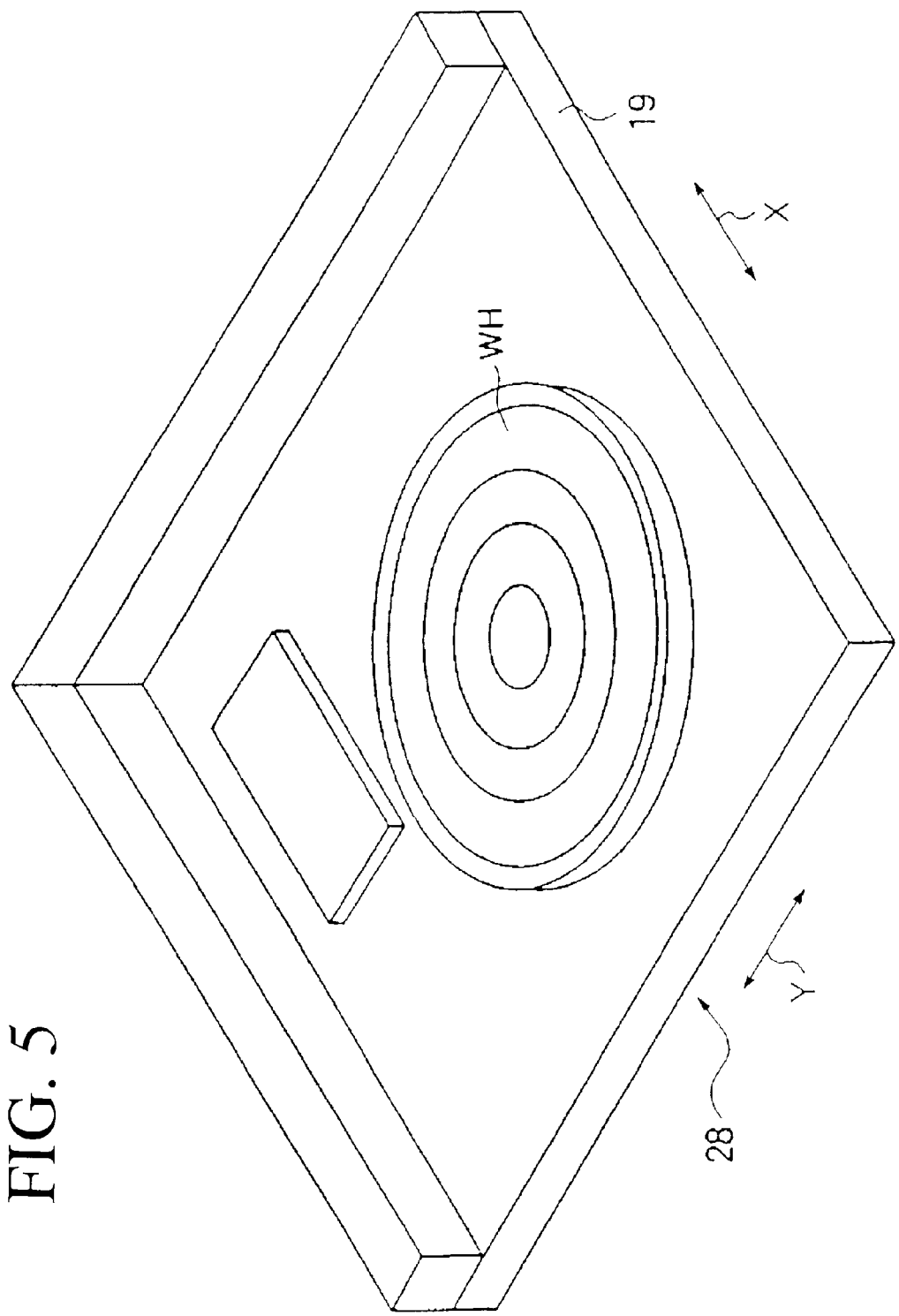
FIG. 5 is a perspective view of a wafer stage.
Figure 8:
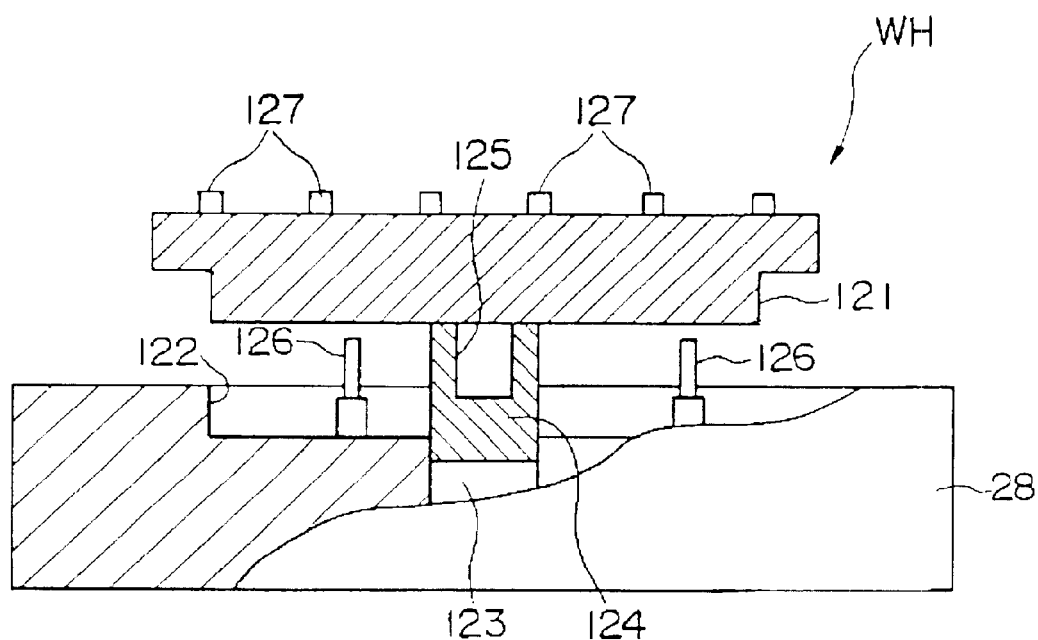
FIG. 8 is a cross sectional side view of the wafer stage and a wafer holder.

Next, the primary structures of the wafer stage and the wafer holder will be explained with reference to FIGS. 5 and 8. The wafer holder WH is held on the wafer stage 28 (z-tilt stage 19) by vacuum suction. A circular hole 122 is formed on the wafer stage 28 so as to couple with a small diameter bottom section 121 of the wafer holder WH, and a circular guide hole 123 is formed vertically in the center section of the bottom surface of the circular hole 122. A holder support member 124 is inserted into the circular guide hole 123 to enable to move vertically within the hole 123, and the holder support member 124 is operated by a support driver (not shown). The guide hole 123, holder support member 124 and the support driver constitute a holder attaching/detaching mechanism.

A U-shaped flat groove 125 is formed at the upper end of the holder support member 124 for inserting, by way of the flat groove 125, the tip of a holder transport arm of an automatic holder transport apparatus (to be described later), when it is required to exchange the wafer holder WH. Further, on the inside bottom surface of the circular hole 122, a wafer raising/lowering mechanism constituted by up- and down-pins 126 is provided in the vertical direction for raising and lowering the wafer as well as for supporting the wafer during wafer exchange process. When the wafer holder WH is fixed to the wafer stage 28, the tips of the up-and down-pins 126 can ascend or descend through the wafer holder WH by way of the holes formed to correspond with the pins 126. A protrusion section 127 is generally formed concentrically on the wafer holder WH, and the wafer 14 is placed on the concentrically formed protrusion section.

(4) Wafer Holder Transport System

The exposure apparatus in this embodiment has an automatic holder transport system (diagram omitted) in addition to the automatic wafer transport system. The wafer holder transport system may be similar to the one disclosed in a U.S. Pat. No. 5,825,470.

Figure 9:
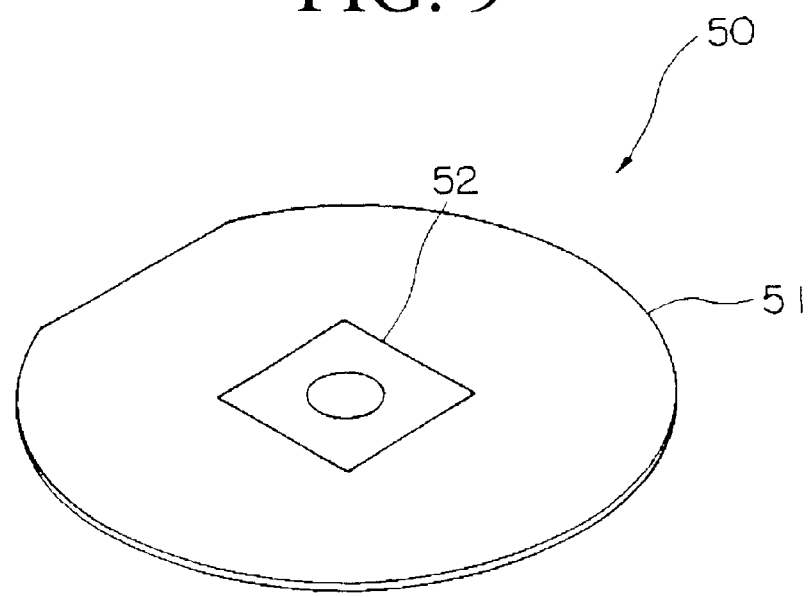
FIG. 9 is an external perspective view of a wafer-type illuminance meter having an optical sensor within a dummy wafer.

The automatic holder transport system is comprised by multi-joint robots, having a hand section for vacuum chucking of wafer holder and transport arms, to detach the wafer holder WH and transport to the storage shelf for storage of wafer holders; to remove a cleaned wafer from the wafer holder storage shelf for transport of a wafer to the vicinity of the wafer stage 28 to be held by vacuum suction to the wafer stage 28. The structure is similar to the automatic wafer transport system described above, so the explanation of its details is omitted (5) Wafer Illuminance Meter A wafer-type illuminance meter 50, based on the step-and-scan method and the photolithographic processing, is used in this embodiment for determining the individual values of illuminance of the exposure apparatuses to equalize the illuminance of all the exposure apparatuses of an exposure system comprised by a mixed arrangement of an exposure apparatus 30a utilizing an exposure light emitted from a KrF excimer laser and exposure apparatuses 30b~30d utilizing an exposure light emitted from ArF excimer lasers. FIG. 1 shows a block circuit diagram of the illuminance meter 50 and FIG. 9 shows an external appearance of the illuminance meter 50.

The illuminance meter 50 includes an optical sensor (illuminance determination section) 52 and an illuminance circuit 54. As shown in FIG. 9, the optical sensor 52 is disposed roughly in the center region of a dummy wafer 51 having roughly the same size as the target wafer (photosensitive substrate base) 14. It should be noted that although the dummy wafer 51 is shaped circular in this embodiment, it is not necessary to limit to a circular shape, so that, for example, when making liquid crystal display element using the present exposure apparatus, a dummy wafer may be shaped roughly in the same size as the glass substrate, that is, a rectangular shape.

The optical sensor 52 has an internal photo-electric conversion element, so as to generate electrical signals in accordance with the energy level of the incident light. Photo-electric conversion element is not particularly limited, such that photo-voltaic devices, Schottky effect devices, opto-magnetic devices, photo-conductive devices, photo-electric devices, pyro-electric devices may be used. However, in this embodiment, it is preferable to use a wideband sensor element that is capable of determining exposure light emitters of different wavelengths, such that each emitter has a specific emission spectrum in a given wavelength band. In this embodiment, it must be able to detect waves emitted from both KrF emitter and ArF emitter. From such a viewpoint, it is preferable to use pyro-electric sensors which are photo-electric sensors based on the pyro-electric effect.

The illuminance circuit 54 is not particularly limited, but in this embodiment, it is integrated in the dummy wafer 51 as in the case of the optical sensor 52. As shown in FIG. 1, the illuminance circuit 54 has an amp circuit 56 to receive signals (illuminance signal) output from the optical sensor 52 through the bus line 53. The amp circuit 56 is connected to the gain memory device 64, and amplifies illuminance signal output from the optical sensor 52 according to various values of gain stored in the gain memory device 64.

The gain memory device 64 stores predetermined values of gain depending on the type of exposure light being amplified, and in this embodiment, gains for KrF excimer and gain for ArF excimer are stored. Operations of the amplifiers will be described later.

A peak-hold (P/H) circuit 58 is connected to the amp circuit 56 for storing the peak values of the illuminance signal amplified in the amp circuit 56. The P/H circuit 58 is connected to an analogue/digital (A/D) conversion circuit 60, and the peak values of the illuminance signals stored in the P/H circuit 58 are converted to digital signals.

The A/D conversion circuit 60 is connected to a calibration circuit 62, and the digital signals (illuminance signals) converted by the A/D conversion circuit 60 are adjusted in the calibration circuit 62. Adjustments by the calibration circuit 62 are carried out according to the calibration values stored in the calibration value storage device 66 connected to the calibration circuit 62. Pre-determined calibration values according to the type of exposure light emitters are stored in the calibration value storage device 66, and in this embodiment, calibration values for KrF exposure light and for ArF exposure light are stored. The method of determining the calibration values will be described later.

The reasons for the calibration circuit 62 to perform calibration process by will be explained in the following. That is, digital signals prior to being input in the calibration circuit 62 correspond to the illumination levels of the incident light entered in the optical sensor 52, but to compute individual values of illuminance from these digital signals, it is necessary to consider variables such as possible differences in gains in the amp circuits 56 and wavelength-dependency of the sensing element in the optical sensor 52. Unless such calibrations are applied, it is not possible to compute and display correct illuminance. Here, in this embodiment, because two types of emitters, KrF and ArF, are used, two type of calibration values, one for KrF and one for ArF, are required to compute respective values of illuminance.

A storage device 74 is connected to the output end of the calibration circuit 62 for storing the result data, and the data converted to illuminance (entrance energy) corrected in the calibration circuit 62 are stored in the result data storage section 74. The result data stored in the result data storage section 74 (data converted to illuminance in the calibration circuit 62) can be read by connecting reading means such as data read device (not shown) and host computer 76 to the input/output terminal 72, as necessary. Here, result data can be accessed wirelessly by providing a wireless communication device in the illuminance circuit 54.

Also, in this example, although the optical sensor 52 and the illuminance circuit 54 are integrally provided on the dummy wafer 51, it is permissible to provide only the optical sensor 52 on the dummy wafer 51 and the illuminance circuit 54 is provided separately from the dummy wafer 51 and the two components are connected with a flexible cable 53. Also, the optical sensor 52 and a wireless communication device may be provided on the dummy wafer 51, and establish an illuminance circuit 54 separately from the dummy wafer 51 so that the detected values of the optical sensor 52 can be transmitted wirelessly to the illuminance circuit 54. Here, it is preferable to display the result data stored in the result data storage section 74 on a display device.

The illuminance meter 50 can be made by using a device wafer 14 to serve the function provided by the dummy wafer 51 and fabricating the optical sensor 52 and the illuminance circuit 54 on the device wafer 14 using photolithography, or by using a printed circuit or a thin instrument plate (ceramic plate for example) with a printed circuit to serve as the dummy wafer 51, and fabricating the optical sensor 52 and the illuminance circuit 54 on the printed circuit.

The gain storage device 64 and the calibration value storage device 66 are connected to a switching circuit 68 when necessary. The switching circuit 68 outputs a switching signal to the storage devices 64, 66 and/or amp circuit 56 and calibration circuit 62 so as to switch the calibration value to be used in the calibration circuit 62 depending on the type of illumination light being received in the optical sensor 52.

Switching signals produced in the switching circuit 68 may be generated according to a manually input signal in the input device 70 or according to a wireless signal output from a remote wireless terminal. There is no particular restriction to the input device 70, but an example is a DIP (dual-in-line-package) switch. The operator selects manually the type of exposure light (in this case, KrF or ArF), whose illuminance is to be determined, using the input device 70. When a type of exposure light (KrF or ArF in this case) is selected by the input device 70, the switching circuit 68 outputs a switching signal to select the gain to be used in the amp circuit 56 and the calibration value to be used in the calibration circuit 62, and reads the required values from each of the storage devices 64, 66.

It is possible to connect devices to the input/output terminal 72 shown in FIG. 1 for controlling the exposure apparatuses 30a~30d fitted with optical sensors 52, or to a host computer 76 shown in FIG. 3, and in so doing, a selection signal showing the type of exposure light (in this case, KrF or ArF) to be used in the exposure apparatuses 30a~30d can also be input from such devices.

Next, a method of determining the values of gain to be stored in the gain storage device 64 and the calibration values to be stored in the calibration value storage device 66 will be explained.

The sensitivity of the photo-resist material used in the exposure apparatus based on ArF excimer is generally more sensitive than that used in the exposure apparatus based on KrF excimer. Also, because the energy stability of KrF excimer is superior to that of ArF excimer, the number of integrated pulses is higher for ArF excimer in order to improve the precision of exposure level control. For this reason, per-pulse energy of ArF excimer is less than that of KrF excimer, and the difference in the energy levels of the incident beams is typically several to several tens of multiples.

Therefore, using the conventional techniques, it is likely that when an illuminance meter optimized to KrF excimer laser exposure apparatus is used to measure illuminance of ArF excimer laser exposure apparatus, it would not produce a measurement range of sufficiently broad linearity.

Another reason is that, when the operational wavelengths are different, sensitivity varies slightly among the various wavelength-dependent sensors so that a calibration value for KrF excimer laser cannot be used for ArF excimer laser to obtain accurate absolute values of illuminance in both types of excimer lasers.

It is for these reasons described above that two types of gains (one group of gains for KrF excimer laser and another group of gains for ArF excimer laser) are stored in the gain storage device 64, and are switched according to the wavelength of operational exposure light being used. Also, two types of calibration values are stored in the calibration value storage device 66, and are switched according to the wavelength of operational exposure light being used.

A method of determining the gains for KrF laser and ArF laser to be stored in the gain storage device 64 will be explained.

Figure 2:
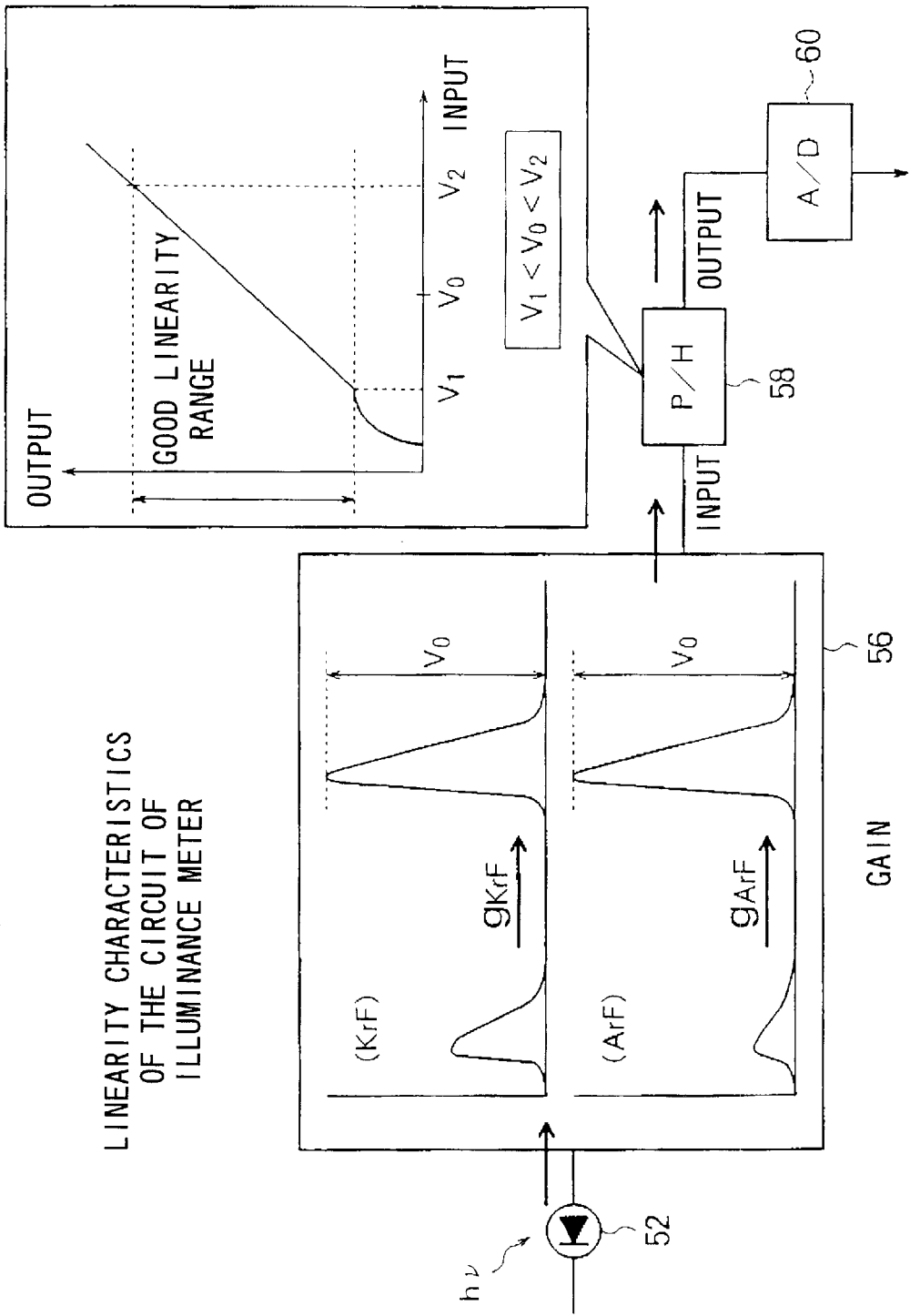
FIG. 2 is a series of diagrams of the operational characteristics of important circuits of the illuminance meter shown in FIG. 1.

As shown in FIG. 2, a good linear relationship is obtained between input signals (input voltage) and output signals (output voltage) in the P/H circuit 58 when the input voltage V0 is higher than V1 and lower than V2. In other words, the linearity of results obtained by the illuminance meter 50 is dependent on the tracking ability of the P/H circuit 58. Therefore, to compute a precise value of illuminance, it is necessary to set the gain in the amp circuit 56 by maintain the output voltage V0 (input voltage to the P/H circuit 58) within the range of V1<V0<V2.

1n carrying out this process, because the per-pulse energy of KrF excimer laser is different than that of ArF excimer laser, values are determined separately for the KrF gain gKrF and the ArF gain gArF so that the output voltage will be approximately V0 for both. The values of KrF gain gKrF and ArF gain gArF are stored in the gain storage device 64 shown in FIG. 1. Memory operation can be carried out either manually through the input device 70 shown in FIG. 1 or by inputting data through the input/output terminal 72.

Also, per-pulse energy values for KrF and ArF excimer lasers may be obtained by analytical simulation or by actual measurements.

Next, determination of the calibration values for KrF and ArF excimer lasers in the calibration value storage device shown in FIG. 1 will be explained.

Figure 6:
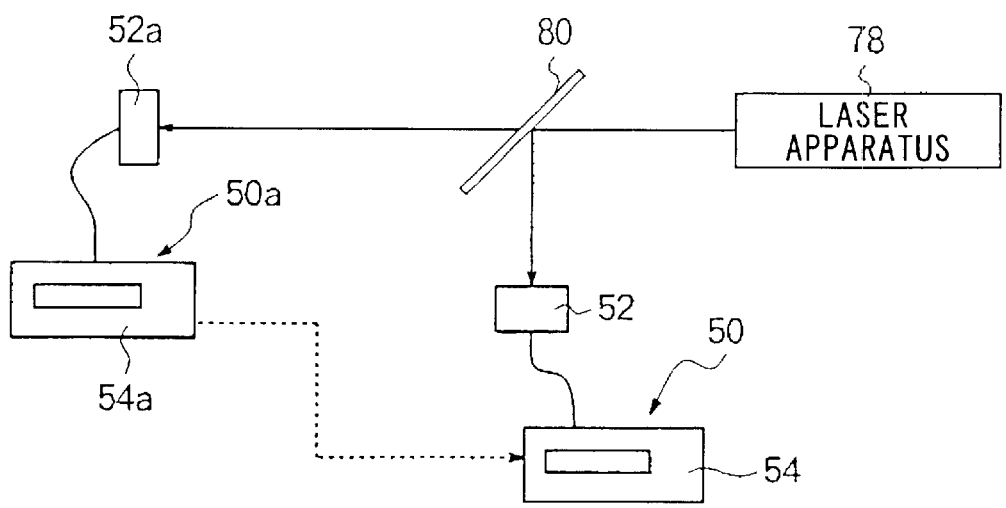
FIG. 6 is a schematic diagram to show a method of calibrating the illuminance meter.

One method of determination is shown in FIG. 6. First, KrF laser emitter 78 is used to inject light pulses output from the laser apparatus 78 simultaneously into the optical sensor 52a of the KrF reference illuminance meter 50a through the beam splitter 80 of known reflectance and transmittance and into the optical sensor 52 of an illuminance meter 50 to be calibrated. In carrying out this calibration process, the gain in the amp circuit 56 of the illuminance meter 50 to be calibrated is switched to the KrF gain gKrF using the switching circuit 68. Next, the KrF calibration value is determined by adjusting the reflectance and transmittance of the beam splitter 80 so that the detected value of the illuminance meter 50 to be calibrated matches with the detected value of the KrF reference illuminance meter 50a, and the calibration value thus determined is stored in the calibration value storage device 66 in the illuminance meter 50 shown in FIG. 1. Determining and storing of KrF reference values may be carried out manually or automatically by connecting the reference illuminance meter 50a and the calibration illuminance meter 50 directly or indirectly through other devices.

The process of determining and storing ArF calibration values is performed by using ArF emitter in the laser apparatus 78 shown in FIG. 6, using the reference illuminance meter 50a for ArF laser, and entering the ArF gain gArf as the gain for the amp circuit 56 of the calibration illuminance meter 50 using the switching circuit 68; and carrying out the measurement process as described above.

(6) Illuminance Measurement Method

For measuring the illuminance, a dummy wafer 51 is placed, in a similar manner to a regular wafer 14, on a wafer storage shelf 108 or 109 or on a platform 110 or 111 of a target exposure apparatus to determine its illuminance and, so that the dummy wafer 51 can be transported by the wafer transport apparatus (transport system) 103, in a similar manner to the regular wafer 14, and vacuum chucked on the wafer holder WH. Next, the wafer stage 28 is moved in x-and y-directions so that the exposure light propagated through the optical projection system 13 shown in FIG. 4 is injected in the photo-converter element of the optical sensor 52 on the dummy wafer 51 to measure the level of illuminance at the image plane (or its vicinity) of the optical projection system 13.

Here, the incident surface of the optical sensor 52 provided integrally on the dummy wafer 51 is placed directly below and close to the aperture plate, and for the purpose of measuring illuminance, the z-tilt stage 19 is adjusted to adjust the position of the dummy wafer 51 so that the bottom surface of the aperture plate, i.e., the incident surface of the optical sensor 52, is approximately coincident with the image plane of the optical projection system 13.

When illuminance measurements are finished, the wafer transport apparatus 103 receives the dummy wafer 51 from the wafer holder WH, and transports it in the same manner as in the case of the regular wafer 14 to return the dummy wafer 51 to the wafer storage shelf 108 or 109 or to place it on the temporary storage platform 110 or 111. Next, the operator removes the dummy wafer 51 from the chamber 102, and the host computer 76 and the like is contacted to read the result data stored in the result data storage section 74. Here, reading of result data may be carried out when one exposure apparatus is completed, or after completing a plurality of exposure apparatuses. Also, the dummy wafer 51 may be continuously passed along from one exposure apparatus to another exposure apparatus automatically so as to perform illuminance measurements for all the exposure apparatuses automatically.

Also, in this embodiment, single illuminance meter 50 is used in combination with switching means to switch between the gains to be used in the amp circuit 56 and the calibration values to be used in the calibration circuit 62 for KrF and ArF excimer lasers, and therefore, single illuminance meter 50 can be used to measure illuminance for both KrF exposure apparatus and the ArF exposure apparatus.

The output illuminance signals obtained by the illuminance meter 50 are used to calibrate optical sensors provided in the integrated sensor 25 and illumination uniformity sensor 21, or to match the exposure levels of different exposure apparatuses 30a~30d.

Embodiment 2

Figure 10:
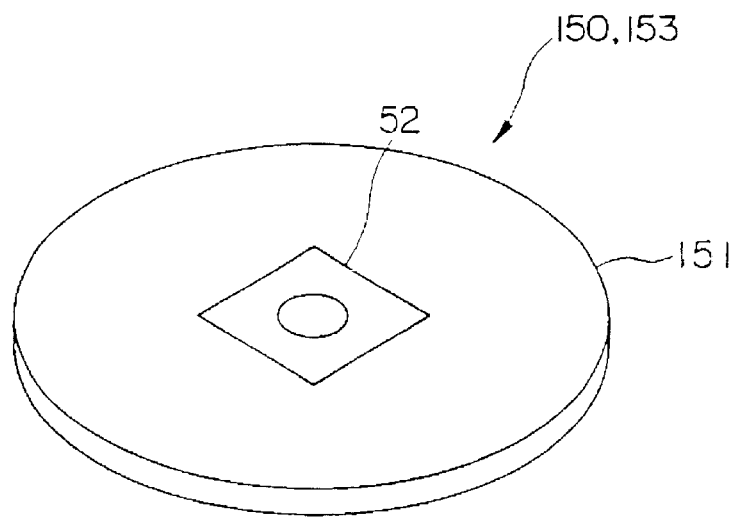
FIG. 10 is an external perspective view of a wafer-type illuminance meter in Embodiment 2 having an optical sensor within a dummy wafer.

Embodiment 2 will be explained in the following. FIG. 10 shows a perspective view of a holder-type illuminance meter having an integrated optical sensor, or a wafer holder having an integrated optical sensor. The parts of the system that are the same as those in Embodiment 1 are referenced by the same reference numerals and explanations are omitted.

That is, as shown in FIG. 10, the holder-type illuminance meter 150 is almost the same as the illuminance meter 50 in Embodiment 1, except that the optical sensor 52 is placed approximately in the center of a dummy holder (whose wafer holding function is immaterial) 151, which is made into roughly a same size as the wafer holder WH. The external shape of dummy holder 151 is about the same as that of the wafer holder WH shown in FIG. 8.

For measurement of illuminance, a dummy holder 151 is placed, as in the case of a regular wafer holder WH, on a holder storage shelf or on a platform of a target exposure apparatus to determine its illuminance so that the dummy wafer 151 can be transported by the above-described wafer holder transport apparatus (has a similar construction to the wafer transport system 103) as in the case of the regular wafer holder WH, and is vacuum chucked on the wafer stage 28. Next, the wafer stage 28 is moved in x-and y-directions so that the exposure light propagated through the optical projection system 13 shown in FIG. 4 is injected in the photo-electric converter element of the optical sensor 52 on the dummy holder 151 to measure the level of illuminance at the image plane (or its vicinity) of the optical projection system 13.

Here, the incident surface of the optical sensor 52 provided integrally on the dummy holder 151 is placed directly below and close to the aperture plate, and for the purpose of measuring illuminance, the z-tilt stage 19 is adjusted to adjust the position of the dummy wafer 51 so that the bottom surface of the aperture plate, i.e., the incident surface of the optical sensor 52, is approximately coincident with the image plane of the optical projection system 13.

When illuminance measurements are finished, the wafer transport apparatus receives the dummy holder 151 from the wafer stage 28, and transports it in the same manner as the regular wafer holder WH to return the dummy holder 151 to the holder storage shelf or to place it on the platform. Next, the operator removes the dummy holder 151 from the chamber 102, and the host computer 76 and the like is contacted to read the result data stored in the result data storage section 74. Here, reading of result data may be carried out when one exposure apparatus is completed, or after completing a plurality of exposure apparatuses. Also, the dummy holder 151 may be continuously passed along from one exposure apparatus to another exposure apparatus automatically so as to perform illuminance measurements for all the exposure apparatuses automatically.

Here, illuminance measurements are performed using a dummy holder (wafer holding function is immaterial) with an integrated optical sensor 52, but in place of such a dummy holder 151, a wafer holder (sensor integrated wafer holder) 153 having an optical sensor 52 integrated into the wafer holder WH itself may be used to determine the illuminance of the exposure apparatuses 30a~30d. This arrangement is more efficient because it can be used as a normal wafer holder when illuminance measurements are not being performed.

The embodiments above are presented for facilitating understanding the present invention and are not intended to limit the present invention. Therefore, various elements disclosed in the above embodiments include design modifications and equivalent elements that are within the fundamental technical aspects of the present invention.

For example, in the above embodiments, the wafer-type illuminance meter 50, holder-type illuminance meter 150 or sensor-integrated base holder are used by switching between the two types of KrF and ArF lasers, but it is obvious that the illuminance meters that are not switched between the light sources can also be used. The combination of wavelengths is not limited to those illustrated, and other wavelengths combinations can also be measured. Further, combination of different wavelengths may include not only two waves but three or more waves may be incorporated. Furthermore, to measure the illumination level of exposure beams having different levels of light energy with high precision, switching may be made according to input energy levels of the exposure beams.

Also, the circuits and apparatuses comprising the illuminance circuit 54 shown in FIG. 1 can be constructed only of electrical circuits (hardwares) to perform various functions, but a portion or all of the functions may be executed by means of application softwares.

Furthermore, in the above embodiments, reduction projection based on the step-and-scan method, so-called scanning stepper, was used, but the present invention is applicable to the regular reduction projection apparatus, so-called stepper, which is based on a static exposure of the entire pattern of the stationary reticle 11 on one shot region in a single exposure of a stationary wafer 14. The present invention may also be applied to other types of exposure apparatuses based on methods such as mirror projection method or proximity method.

It should also be noted that although the optical projection system 13 shown in FIG. 4 is based entirely on refracting elements (lenses), but reflective elements (mirrors and the like) only may be used, or kata-dioptric optical system comprised by a combination of refractive and reflective elements (convex mirror and flat mirrors and the like). The optical projection system 13 is not limited to reduction projection system and may also be a contact or magnification system.

The present invention is further applicable to SOR (scanning optical repeater) apparatus emitting EUV (extreme ultra violet) radiation in the soft x-ray range, or to a reduction projection scanning exposure apparatus based on a laser plasma light source, or to a proximity type x-ray scanning exposure apparatus.

Embodiment 3

The illuminance meter, illuminance measuring method and exposure apparatus in Embodiment 3 will be explained in the following. In this embodiment, instead of the wafer holder WH detachably disposed on the wafer stage 28, a probe (instrument plate) 209 of an illuminance meter 208 is used.

Figure 11:
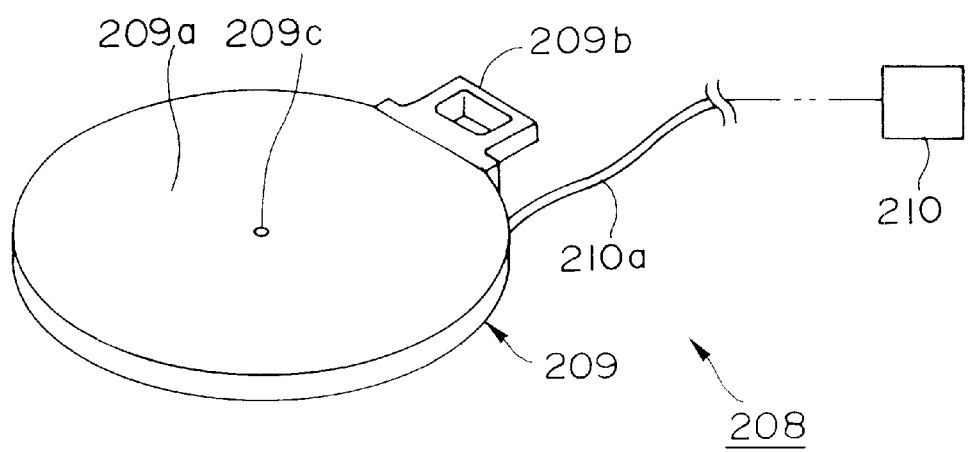
FIG. 11 is a perspective view of an illuminance meter in Embodiment 3 provided with an attaching section.

As shown in FIG. 11, the illuminance meter 208 measures the exposure light energy radiating on the wafer W retained on the wafer holder WH on the wafer stage 28 using the optical sensor 209a on the wafer stage 28, and it includes a probe 209 having an optical sensor 209a and a meter body 210 for processing the signals received from the probe 209 and computing illuminance. In this case, the probe 209 has the same size as the wafer holder WH.

That is, the probe 209 has a light receiving window 209c in the center region so that the center of an optical sensor 209a whose sensing area is sufficiently large to receive refracted rays in relation to the projection lenses and the working distance, will be disposed directly below the window 209c. Further, a clamping block (clamping section) 209b to fit the hook and has the same structure as the wafer holder WH is provided in a periphery of the probe 209a. Also, a cable 210a connected to the external meter body 210 is provided for sending detected signals to the meter body 210.

The illuminance meter 208 is a so-called reference meter for maintaining the level of detection precision of other sensors such as integrated sensor 25 and illumination uniformity sensor 21, and the results obtained by other sensors are calibrated against the results obtained by the illuminance meter 208. Such calibration operation is performed periodically (once a week, for example) to maintain the detection precision of other optical sensors. By sharing the results produced by this meter 208 among the different exposure apparatuses, exposure levels within a given duration of exposure are made interchangeable among the various exposure apparatuses.

Figure 12:
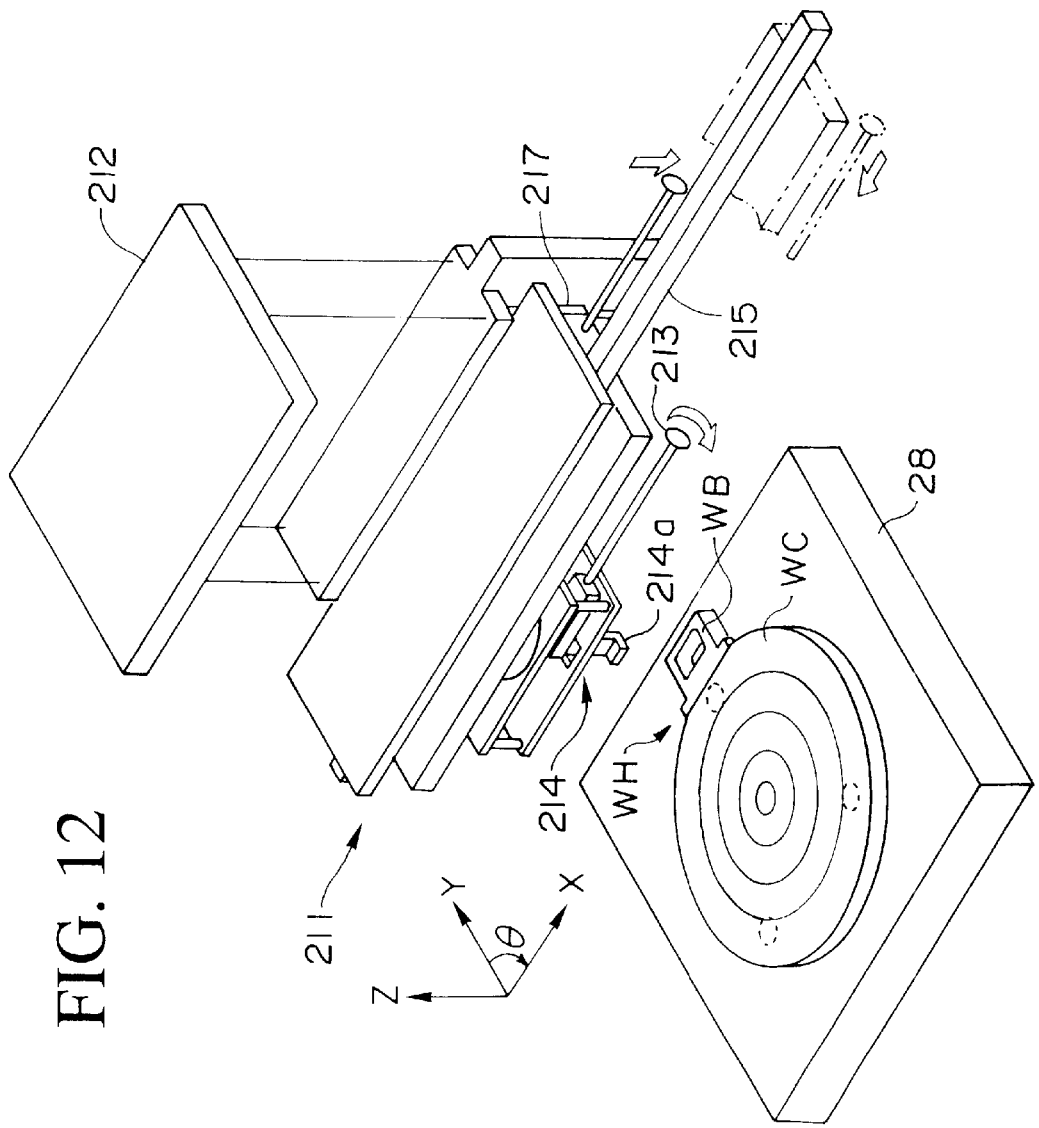

As shown in FIG. 12, the exposure apparatus is further provided with a holder exchanger (attaching/detaching mechanism, holder transport mechanism) 211 on a column 212 of the exposure apparatus, for detaching and exchanging the holder including the wafer holder WH and the probe 209 on the wafer stage 28.

The holder exchanger 211 is provided for the purpose of replacing a used wafer holder WH with another wafer holder WH, and, instead of the wafer holder WH, the probe 209 having the same size as the wafer holder WH can also be transported thereon.

The wafer holder 211 is designed so that the holder clamping unit 214 can be moved along the x-guide section 215 by pushing the x-lever 213 in the x-direction shown in FIG. 12, until the plunger (not shown) locks the position of the wafer holder WH or the probe 209 along the x-direction, and it can be retracted to a standby position by pulling the x-lever 213 frontward.

Also, by pushing the z-lever 216 downward, the holder clamping unit 214 is moved along the z-guide section 217, and the wafer holder WH or the probe 209 can be lowered to the clamping position by catching the z-lever 216 on the lever stop (not shown). Further, a micro-z-adjust bolt (not shown) is provided so as to avoid touching the AF cover (not shown) and optical sensors. Micro-adjustment of rotation in x-y plane (θ-adjustment) is performed by rotating the x-lever 213 in θ-direction.

The wafer holder WH or the probe 209 is clamped by rotating the x-lever 213 about its axis, and using the hooking section 214a of the holder clamping unit 214 for the wafer holder WH or the probe 209 to hook on the clamping block so as to lock the clamping hook (not shown) to prevent the wafer holder WH or the probe 209 from dropping.

The procedure for exchanging the wafer holder WH or the probe 209 using the holder exchanger 211 is as follows: the holder exchanger 211 is attached to the column 212 of the exposure apparatus, the vacuum holding the wafer holder WH on the wafer stage 28 is cut for detachment, the wafer holder WH is moved to the clamping position using the x-lever 213, and the holder exchanger 211 is lowered to the clamping position using the z-lever 216.

Next, the clamping block (clamping section) WB provided on the outer periphery of the base chucking section WC of the wafer holder WH is clamped by swinging the x-lever 213, and the wafer holder WH is fixed in place by using the lock, and the wafer holder WH is pulled into the standby position by pulling the x-lever 213 while floating the wafer holder WH by the z-lever 216. The lock is released at this point, and the wafer holder WH is detached by rotating the x-lever 213 in the opposite direction.

To install the probe 209 on the wafer stage 28, the above procedure is reversed. Accordingly, the probe 209 is mechanically positioned in a specified position on the wafer stage 28 as in the case of positioning the wafer holder WH.

To measure illuminance or integrated exposure level on the wafer surface using the illuminance meter 208 after exchanging the wafer holder WH with the probe 209 using the holder exchanger 211, the wafer stage 28 is moved from the holder exchange position to the lower section of the optical projection system 13 so that the light receiving window 209c is placed in a desired position within the illumination region, so as to radiate the illumination light on the wafer stage 28 through the illumination optics and projection optics 13. At this time, exposure light entering through the window 209c is received in the optical sensor 209a, and the signals generated according to the energy of the exposure light are sent to the meter body 210 through the cable 210a to compute a value of illuminance. Because the size of the window 209c is several tens of micrometers, the method of mechanical positioning on the wafer stage 28 described above is acceptable for placing the probe 209 in the illumination region with sufficient precision.

Accordingly, in this embodiment, because illuminance is measured with the probe 209 of the illuminance meter 208 having the same size as the wafer holder WH, and the probe 209 is positioned by exchanging the wafer holder WH with the probe 209 using the holder exchanger 211 (used for attaching and detaching the wafer holder WH on the wafer stage 28) on the wafer stage 28, the operator does not need to place the probe manually on the wafer stage 28 and the probe 209 can be positioned on the wafer stage 28 easily but with high precision.

Embodiment 4

Figure 13:
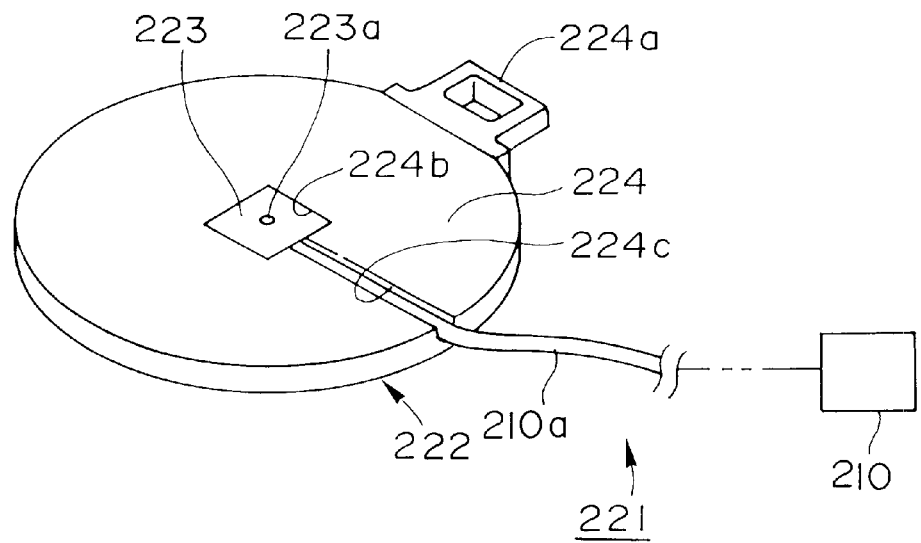
FIG. 13 is a perspective view of an illuminance meter in Embodiment 4 having a data communication cable.

The illuminance meter, illuminance measuring method and exposure apparatus in Embodiment 4 will be explained with reference to FIG. 13.

Embodiment 4 differs from Embodiment 3 in the following point. In the probe 209 of Embodiment 3, the optical sensor 209a itself has the same size as the wafer holder WH, but the illuminance meter 221 in Embodiment 4 has an optical sensor 223 as a separate member of a probe 222, as shown in FIG. 13, and the probe 222 is constructed by attaching an adapter 224 of the same size as the wafer holder WH to the optical sensor 223.

In other words, the probe 222 is comprised by an adapter 224 of the same size as the wafer holder WH and a clamping block (clamping section) 224a, and a rectangular shaped optical sensor 223 inserted in a cavity section 224b formed in the center region of the adapter 224.

The upper surface of the optical sensor 223 is shaded from light except in the center window 223a, and is further provided with a cable 210a connected to the meter body 210 for transmitting signals to the meter body 210.

The adapter 224 has a groove section 224c extending from the cavity section 224b to the periphery for embedding the cable 210a.

In this embodiment, because the probe 222 is separated from the optical sensor 223 and the adapter of the same size as the wafer holder WH is used to attach to the optical sensor 223, the optical sensor 223 can be detached from the adapter 224 for use in carrying out other measurements, and there is no need to fabricate the sensor itself in the same size as the wafer holder WH.

Embodiment 5

Figure 14:
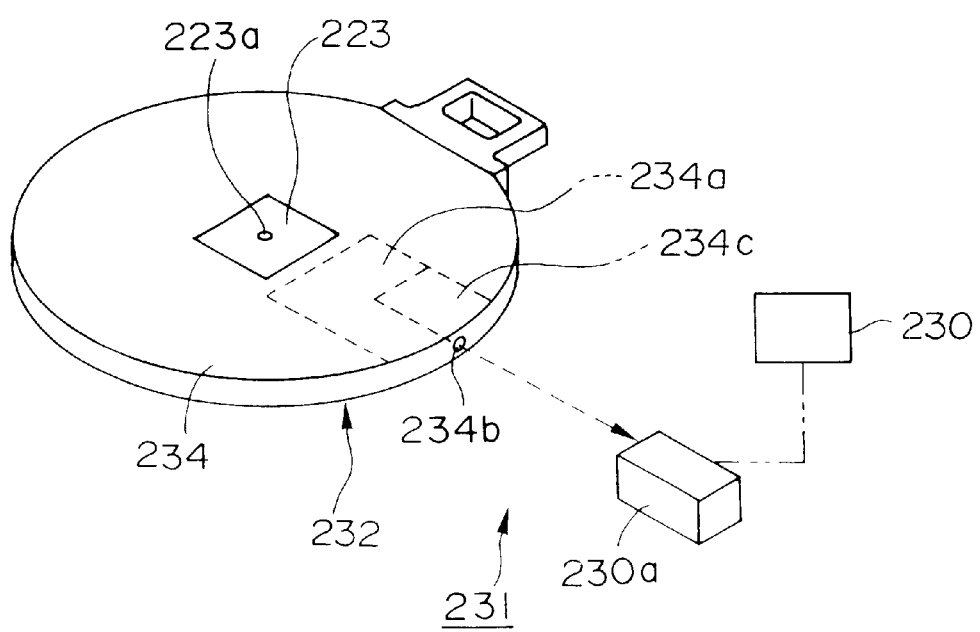
FIG. 14 is a perspective view of an illuminance meter in Embodiment 5 having a wireless data communication device.

The illuminance meter, illuminance measuring method and exposure apparatus in Embodiment 5 will be explained with reference to FIG. 14.

Embodiment 5 differs from Embodiment 4 in the following point. The probe 222 in Embodiment 4 converts incident light energy radiating on the optical sensor 223 into electrical signals, which are sent to the external meter body 210 through a cable 210a, while the illuminance meter 231 in Embodiment 5 transmits electrical signals (information regarding the exposure light energy) from the optical sensor 223 by infra-red signals to the meter body 230 as illustrated in FIG. 14.

That is, the adapter 234 of the probe 232 incorporates internally: an A/D converter circuit 234a, for converting the electrical signals from the optical sensor 223 to digital signals; a light emitting element (sending mechanism) 234b for sending converted signals externally from the A/D converter circuit 234a from its peripheral section; and a power section 234c comprised by a battery for supplying electrical power to the optical sensor 223, the A/D converter circuit 234a and the light emitting element 234b.

Also, the external meter body 230 is provided with a light detecting element (receiving means) 230a for receiving light signals from the light emitting element 234b, and the light detecting element 230a is disposed in a location suitable for receiving light signals emitted from the probe 232 positioned on the wafer stage 28. Here, the exposure apparatus in this embodiment is provided with a wafer stage 28 for retaining and transporting the probe 232 of the illuminance meter 231.

In this embodiment, exposure light injected into the optical sensor 223 is converted to electrical signals, which are converted to digital signals in the A/D converter circuit 234a, and the converted signals are wirelessly transmitted from the light emitting element 234b through space and are received by the external light detecting element 230a, so as to compute a value of illuminance in the meter body 230.

Accordingly, cable is unnecessary for transmitting light signals, thereby facilitating handling of the probe 232, and enabling accurate signals to be transmitted because digitized optical signals are used as communication medium, thereby lessening adverse effects caused by electromagnetic interference. Also, because the A/D converter circuit 234a, the light emitting element 234b and the power section 234c are housed inside the adapter 234, overall shape of the probe 234 can be made the same as the wafer holder WH so as to be interchangeable with the wafer holder WH.

In this embodiment, a photo-electric device for charging the battery, a solar panel for example, may be placed in a location on the surface of the adapter 234 not occupied by the optical sensor 223. Battery can be changed before or concurrently with taking energy measurements using the optical sensor 223, by utilizing the solar panel to absorb the energy of the exposure light.

Such an arrangement eliminates the task of battery charging, and the probe 232 can continue to work for a prolonged period of time in the exposure apparatus.

Embodiment 6

Figure 15:
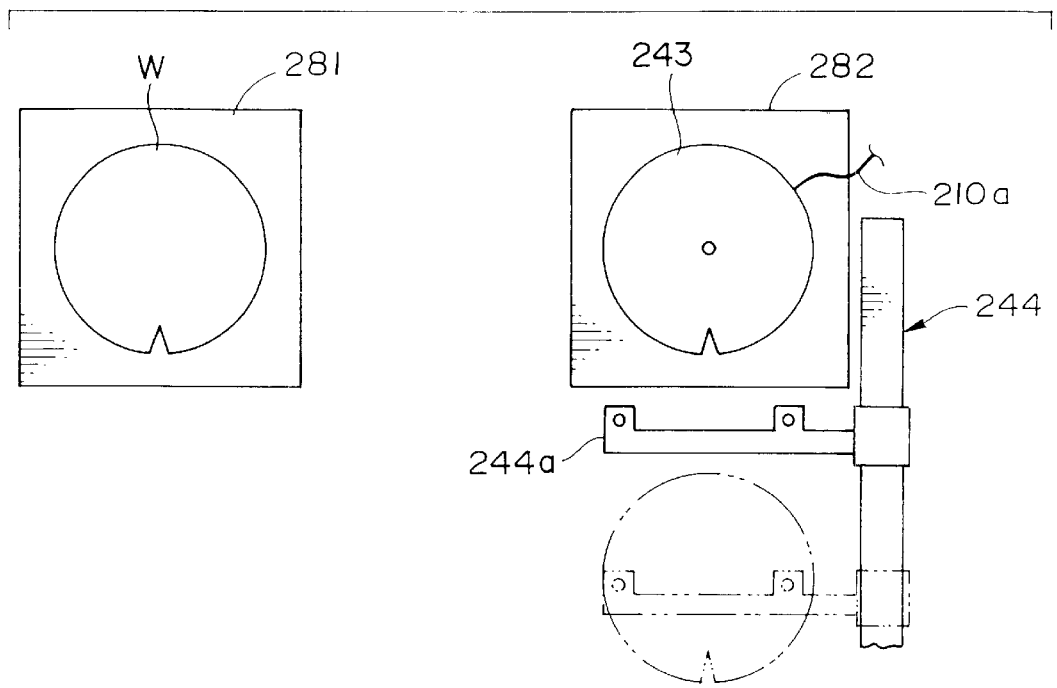
FIG. 15 is a plan view of a double-wafer type illuminance meter in Embodiment 6.
Figure 16:
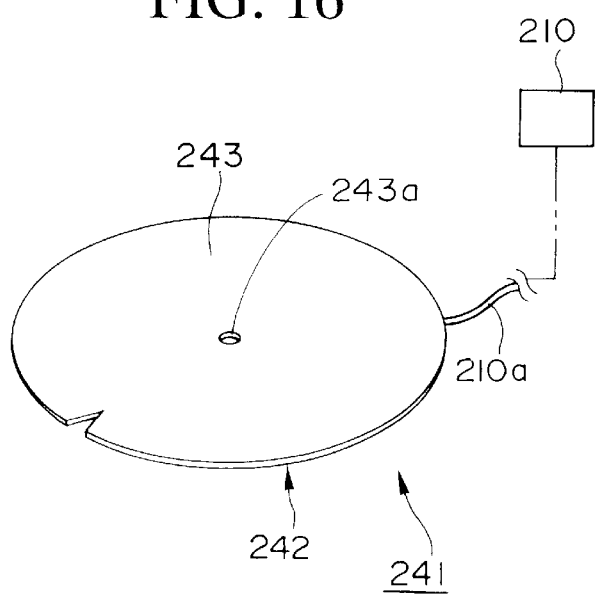
FIG. 16 is perspective view of an illuminance meter in Embodiment 6 having a data communication cable.

The illuminance meter, illuminance measuring method and exposure apparatus in Embodiment 6 will be explained with reference to FIGS. 15 and 16.

Embodiment 6 differs from Embodiment 3 in the following points. The exposure apparatus in Embodiment 3 has one wafer stage 28 while the exposure apparatus in Embodiment 6 has a double-stage structure comprised by two wafer stages 281, 282, as shown in FIG. 15.

Another difference is that, the probe 209 in Embodiment 3 has the same size as the wafer holder WH but the probe 242 in Embodiment 6 is comprised by an optical sensor 243 having the same size as the wafer W, and at least one of the wafer stages 281, 282 can accommodate probe 242 as well as the wafer W. The double stage structure has been disclosed in a Japanese Patent Application, First Publication, Hei 10-163097.

The top surface of the optical sensor 243 is shielded from light except at the light receiving window 243a, and a cable 210a is connected for sending signals to an external meter body 210, as in Embodiment 3.

The exposure apparatus operates as follows. The wafer stages 281, 282 can be moved independently in two-dimensions on a base (not shown) so that while one wafer stage 281 is used to exposure a wafer W, the other wafer stage 282 is used for exchanging the exposed wafer W with the probe 242 by means of the load arm 244a of the wafer loader (load/unload mechanism, base transport mechanism, illuminance meter transport means) 244. In a manner similar to the case of exposing a wafer W, the light receiving window 243a is positioned in a specific spot on the wafer stage (281 or 282) by means of a pre-alignment device (not shown). In this embodiment also, because the size of the light receiving window 243a is several tens of micrometers, the probe can be positioned with sufficient precision in a specific spot within the illumination region of the wafer stage using the pre-alignment device.

Therefore, in this embodiment, loss of productivity caused by interruption due to exposure light energy measuring can be prevented by using two wafer stages 281, 282 to carry out the two tasks independently, i.e., wafer/probe exchange task and the wafer exposure task. Also, because the probe 242 of the illuminance meter 241 has the same size as the wafer W, it is easily possible to exchange the wafer W and the probe 242 on the wafer stage 282 using the wafer loader 244. When the probe 242 is replaced with a wafer W, devices such as optical sensor and signal processing circuit can be fabricated on the wafer using photolithography.

It should be noted that the present invention includes the following variations.

(1) In the illuminance meters 208, 221, 231 presented in Embodiments 3~5, probes 209, 222, 223 have the same size as the wafer holder WH so as to enable the probe to be interchangeable with the wafer holder WH using the holder exchanger 211, but, as demonstrated by the illuminance meter 241 in Embodiment 6, the probes in these embodiments may have the same size as the wafer W so that probe/wafer exchange may be carried out using a wafer transport mechanism such as the wafer loader.

Also, in Embodiment 6, the probe 242 of the illuminance meter 241 may have the same size as the wafer holder WH so that probe/holder exchange on the wafer stages 281, 282 may be carried out using the holder exchanger 211.

(2) In Embodiment 5, signals are transmitted using infrared radiation using light emitting element 234b and light detecting element 230a, but other methods of wireless transmission based on electrical waves may also be used. However, infra-red transmission of signals is preferable in terms of avoiding electromagnetic interference effects, as mentioned earlier.

(3) In Embodiments 3~5, a manually-operated holder exchanger 211 is used, but an automated holder exchanger may also be used. For example, various axes of the holder exchanger 211 may be electrically operated by using actuators such as motors, or as disclosed in a Japanese Patent Application, First Publication, Hei 9-266166, jigs and robots may be used to install/exchange the wafer holder on the wafer stage.

(4) In the embodiments presented above, an illuminance meter is used to determine illuminance or integrated exposure level on the image plane of the wafer stage, but the illuminance meter may be used as a light intensity sensor for determining the uniformity of light in the illumination space. In such a case, the illuminance meter which is normally disposed in a corner of the wafer stage should be moved to a central location of the wafer stage so that the travel distance of the light intensity sensor would be greatly reduced.

(5) The present invention may also be applied to a scanning type exposure apparatus, in which case, mask and substrate will be moved synchronously during the exposure process in these embodiments.

The present invention may also be applied to a proximity type exposure apparatus, in which the projection system is not used, and the masking and the substrate are in close contact during the exposure process for imprinting the making pattern on the substrate.

(6) In each of the embodiments presented above, the illuminance meter (208, 221, 231, 241) is designed so that, when the illuminance meter having roughly the same size as the wafer holder (or wafer) is placed on the wafer stage 28 (or wafer holder WH), the thickness of the illuminance meter is selected such that the top surface (or incident surface) is at about the same height as the surface of the wafer W. Therefore, by placing the wafer stage 28 at a specific height, the surface of the illuminance meter will be at about the same height as the focusing plane of the projection optical system for measuring the exposure light energy.

However, even if the illuminance meter has other thickness value, the surface of the illuminance meter can be positioned at about the same height as the image plane of the projection optical system by determining the height of the illuminance meter surface and moving the wafer stage 28 vertically to the same height according to the measured result.

(7) The use of the exposure apparatus is not limited to semiconductor device production. Other uses include, for example, exposure apparatus for imprinting circuit patterns for liquid crystal display panel on rectangular glass plates or for producing thin film magnetic heads.

(8) The light source of the exposure apparatus in the present invention may include x-rays in addition to g-line (436 nm), i-line (365 nm), KrF excimer laser (248 mn), ArF excimer laser (193 nm), F2 laser (157 nm).

(9) The projection optical system may include contact imprinting and enlarging imprinting in addition to reducing imprinting.

(10) Optical materials for projection optical systems based on extreme ultraviolet rays such as excimer lasers may include quartz and fluorite for transmitting extreme ultraviolet radiation, and for F2 laser and x-rays, reflective/refractive systems or refractive systems (reticle is also made of a reflective type material) may be used.

(11) If linear motors are to be used in wafer stage and reticle stage, either air-levitated type based on air bearings, or a magnetically levitated type based on a Lorentz force or a reactance force may be used. The stages may be a guided type that moves a stage along guide rails or a guideless type with no guides.

(12) When a planar motor is to be used for stage moving mechanism, either the magnetic unit (permanent magnet) or the armature unit is installed on the stage, and the other component of the magnetic unit or armature unit may be installed on the moving surface (base) of the stage.

(13) The reactant force generated by the movement of the wafer stage may be dissipated mechanically to the floor (ground) through the framing members, as disclosed in a Japanese Patent Application, First Publication, Hei 8-166475. The present invention is applicable to an exposure apparatus having such a structure.

(14) The reactant force generated by the movement of the reticle stage may be dissipated mechanically to the floor (ground) through the framing members, as disclosed in a Japanese Patent Application, First Publication, Hei 8-330224. The present invention is applicable to an exposure apparatus having such a structure.

(15) As described above, the exposure apparatus of the present invention is manufactured by assembling various sub-systems, that include the various structural elements disclosed in the claims of the present invention, so as to maintain the required levels of mechanical, electrical and optical precision. To achieve the required degrees of precision in the various sub-systems, apparatus assembly operation are preceded and followed by various inspection/adjustment steps to assure optical precision of the optical systems, mechanical precision of the mechanical systems, and electrical precision of the electrical systems. Assembly of the exposure system is preceded by assembling of various sub-systems to respective specification, so that the exposure apparatus may be assembled by mutual connections of sub-systems involving mechanical connections, wiring of electrical circuits and connections associated with pressure piping. When the final assembly of sub-systems into an exposure apparatus is completed, individual sub-systems are adjusted within the operating environment of the overall adjustments to assure overall precision of the exposure apparatus. Assembly operation for the exposure apparatus should be performed in a cleanroom environment.

Figure 17:
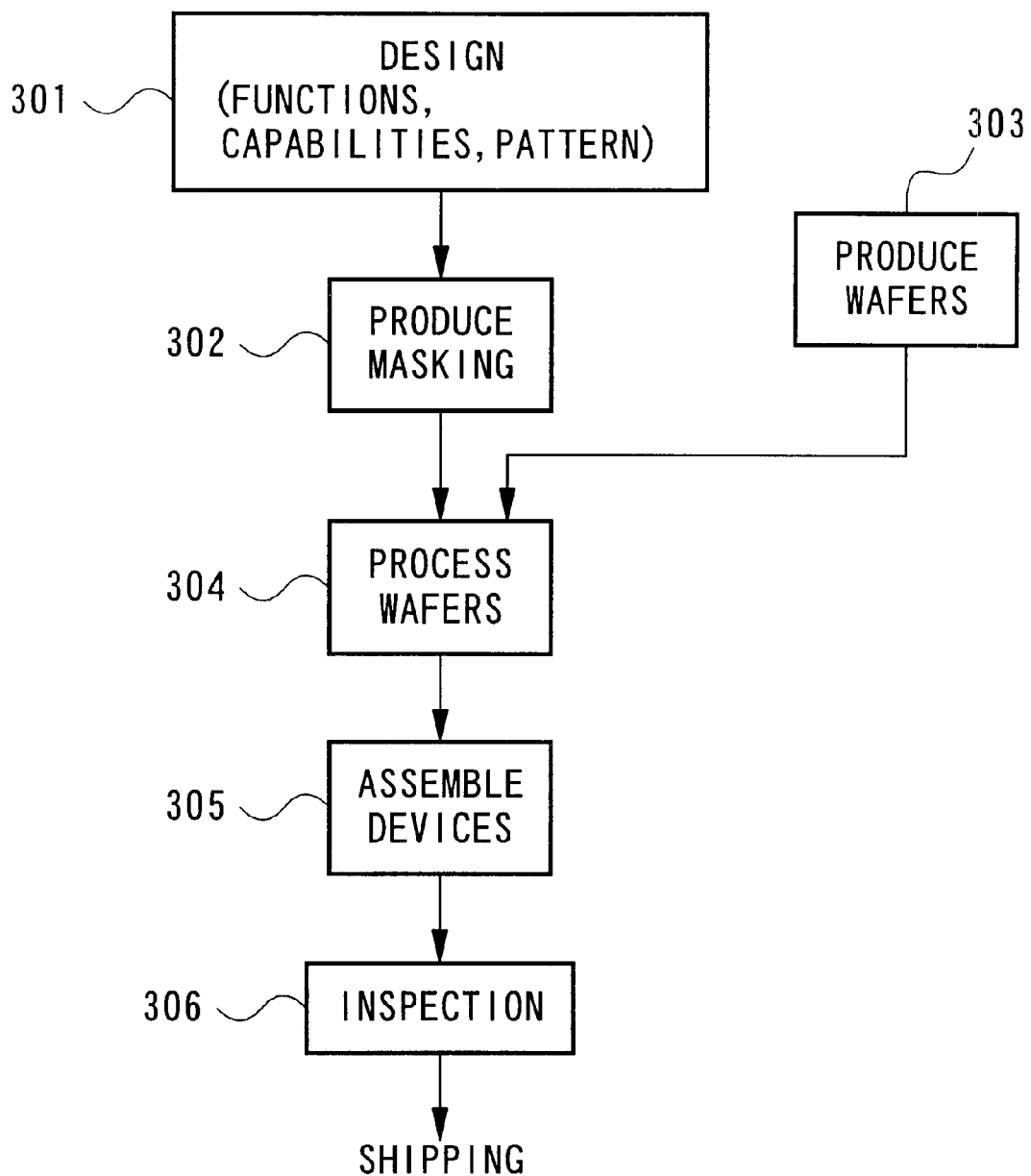
FIG. 17 is a flowchart for an example of the semiconductor device manufacturing based on the use of the illuminance meter of the present invention.

(16) A semiconductor device is produced by the exposure apparatus of the present invention according to a typical flowchart shown in FIG. 17, represented by: step 301 to design functions and capabilities of the device; step 302 to produce a masking pattern (reticle) according to the design; step 303 to produce wafers from silicon ingot; step 304 to process the wafers according to the procedure described to imprint the pattern on the wafer using the exposure apparatus; step 305 to assemble a device (such as dicing, bonding, packaging and other processes); and step 306 to inspect the assembled device.

What is claimed is:

1. An illuminance meter which measures an energy level of a radiation illuminating a substrate being held on a substrate holder attached on a substrate stage, comprising:
    an instrument plate to be attached on a substrate holder attaching section of the substrate stage from which the substrate holder has been detached; and
    an optical sensor provided on said instrument plate for responding to said radiation.

2. An illuminance meter according to claim 1, wherein said illuminance meter is able to be interchanged with a substrate holder by a holder exchanger which is provided for the purpose of replacing a used substrate holder with another substrate holder.

3. An illuminance meter according to claim 2, wherein said illuminance meter is provided with a clamping section which couples with a holder clamping unit of said holder exchanger.

4. An illuminance meter according to claim 1, wherein said instrument plate is provided with a holding section which retains the instrument plate on the substrate stage by means of vacuum suction.

5. An illuminance meter according to claim 1, wherein said instrument plate is provided with a wireless transmitting device which externally transmits energy information related to said radiation obtained by an optical sensor.

6. An illuminance meter according to claim 1, wherein said illuminance meter is provided with a memory section which stores energy information on said radiation determined by an optical sensor.

7. An illuminance meter according to claim 1, wherein said optical sensor is capable of detecting a plurality of types of radiation having different wavelengths, and said illuminance meter is provided with a plurality of memory sections which store energy information related to said plurality of types of radiation.

8. An illuminance meter according to claim 1, wherein said illuminance meter is provided with a battery and a photo-electric converter which charges the battery.

9. An illuminance meter according to claim 1, wherein said illuminance meter is used to determine individual energy levels of exposure light emitted from a plurality of exposure apparatuses so that said individual energy levels are interchangeable among the plurality of exposure apparatuses.

10. A method for measuring an energy level of a radiation illuminating a substrate being held on a substrate holder attached on a substrate stage, comprising the steps of:
    detaching said substrate holder from said substrate stage and attaching an illuminance meter on a substrate holder attaching section of said substrate stage; and
    detecting said radiation by said illuminance meter to obtain energy information related to said radiation.

11. A method according to claim 10, wherein positioning of said illuminance meter is carried out by using a holder exchanger which is provided for the purpose of replacing a used substrate holder with another substrate holder.

12. A method according to claim 10, wherein said method further includes a step of vacuum chucking of the illuminance meter on a substrate stage.

13. A method according to claim 10, wherein said method further includes a step of wireless transmission of energy information determined.

14. A method according to claim 10, wherein said illuminance meter is capable of detecting a plurality of types of radiation having different wavelengths, and adjusts computational parameters for obtaining energy information depending on said types of radiation being measured.

15. A method according to claim 10, wherein said illuminance meter is used to determine individual energy levels of exposure light emitted from a plurality of exposure apparatuses so that said individual energy levels are interchangeable among the plurality of exposure apparatuses.

16. A method according to claim 10, wherein said method further includes a step of determining positional information with respect to a direction of emission of radiation; and a step of adjusting a position of the illuminance meter according to results of said positional information.

17. An apparatus which exposures a substrate with a radiation to project an image of a masking pattern of a mask on the substrate, comprising:
a substrate stage;
a substrate holder attached on said substrate stage so as to hold said substrate; and
a holder exchanger which detaches said substrate holder from said substrate, and attaches an illuminance meter on a substrate holder attaching section of said substrate stage to detect said radiation.

18. A method for exposing a substrate being held on a substrate holder attached on a substrate stage with a radiation to project an image of a pattern of a mask on said substrate, comprising the steps of:
detaching the substrate holder and attaching an illuminance meter which has an optical sensor responsive to said radiation on the substrate stage to measure an energy level of said radiation;
obtaining energy information on said radiation by detecting said radiation with said illuminance meter:
detaching said illuminance meter and replacing with said substrate being held on the substrate holder so as to attach said substrate holder on the substrate stage and to position said substrate on the substrate holder; and
calibrating a sensor for measuring said radiation in accordance with the detected energy information.

19. A method for making semiconductor devices by exposing a substrate using the method of exposure according to claim 18, and producing semiconductor devices from the exposed substrate.

20. An illuminance meter which determines an energy level of a radiation radiating on a substrate held on a substrate stage, comprising:

an instrument plate to be held on the substrate stage by vacuum suction;
an optical sensor disposed on the instrument plate and detecting said radiation;
wherein said substrate is vacuum chucked together with a substrate holder on a substrate edge; and the instrument plate is attached on said substrate holder so as to be interchangeable with said substrate.

21. An illuminance meter which determines an energy level of a radiation radiating on a substrate held on a substrate stage, comprising:
an instrument plate to be held on the substrate stage by vacuum suction;
an optical sensor disposed on the instrument plate and detecting said radiation;
wherein said substrate is vacuum chucked together with a substrate holder on a substrate stage; and the instrument plate is attached on said substrate stage so as to be interchangeable with said substrate holder.

22. A method for determining an energy level of a radiation radiating on a substrate attached on a substrate stage, comprising the steps of:
retaining an illuminance meter on the substrate stage by vacuum suction to determine an energy level of said radiation; and
determining the energy level of said radiation with said illuminance meter to obtain energy information on said radiation;
wherein said substrate is vacuum chucked together with a substrate holder on said substrate stage; and an instrument plate is held on said substrate holder so as to be interchangeable with said substrate.

23. A method for determining an energy level of a radiation radiating on a substrate attached on a substrate stage, comprising the steps of
retaining an illuminance meter on the substrate stage by vacuum suction to determine an energy level of said radiation; and
determining the energy level of said radiation with said illuminance meter to obtain energy information on said radiation;
wherein said substrate is vacuum chucked together with a substrate holder on said substrate stage; and an instrument plate is held on said substrate stage so as to be interchangeable with said substrate holder.

* * * * *